(12) United States Patent
Yasuda et al.

(10) Patent No.: US 10,336,851 B2
(45) Date of Patent: *Jul. 2, 2019

(54) COPOLYMER FOR SEMICONDUCTOR LITHOGRAPHY, RESIST COMPOSITION, AND METHOD FOR MANUFACTURING SUBSTRATE

(71) Applicant: MITSUBISHI RAYON CO., LTD., Chiyoda-ku (JP)

(72) Inventors: Atsushi Yasuda, Yokohama (JP); Miho Chujo, Tokyo (JP)

(73) Assignee: Mitsubishi Chemical Corporation, Tokyo (*) Notice: Subject to any disclaimer, the term of this patent is extended or adjusted under 35 U.S.C. 154(b) by 0 days.

This patent is subject to a terminal disclaimer.

(21) Appl. No.: 14/912,798

(22) PCT Filed: Sep. 3, 2014

(86) PCT No.: PCT/JP2014/073197
§ 371 (c)(1),
(2) Date: Feb. 18, 2016

(87) PCT Pub. No.: WO2015/033960
PCT Pub. Date: Mar. 12, 2015

(65) Prior Publication Data
US 2016/0200849 A1 Jul. 14, 2016

(30) Foreign Application Priority Data

Sep. 3, 2013 (JP) ................................. 2013-182468
Sep. 3, 2013 (JP) ................................. 2013-182469

(51) Int. Cl.
*G03F 7/038* (2006.01)
*G03F 7/039* (2006.01)
(Continued)

(52) U.S. Cl.
CPC .............. *C08F 220/68* (2013.01); *C08F 2/00* (2013.01); *C08F 2/06* (2013.01); *C08F 220/18* (2013.01);
(Continued)

(58) Field of Classification Search
None
See application file for complete search history.

(56) References Cited

U.S. PATENT DOCUMENTS 6,706,826 B1 3/2004 Fujiwara et al.
9,527,938 B2 * 12/2016 Yasuda ................. C08F 220/18
(Continued)

FOREIGN PATENT DOCUMENTS

JP 2002-145955 A 5/2002
JP 2003-43690 A 2/2003
(Continued)

OTHER PUBLICATIONS

International Search Report dated Dec. 2, 2014 in PCT/JP14/73197 Filed Sep. 3, 2014.
(Continued)

*Primary Examiner* — Martin J Angebranndt
(74) *Attorney, Agent, or Firm* — Oblon, McClelland, Maier & Neustadt, L.L.P.

(57) ABSTRACT

A copolymer for lithography having a turbidity Th(80) of 1.0 NTU or more and 4.6 NTU or less and a turbidity Tm(80) of 1.0 NTU or more and 3.8 NTU or less, in which this turbidity Th(80) is a turbidity of a PGMEA solution when n-heptane in an amount to be 80% of (X)h is added to this PGMEA solution where (X)h denotes an amount of n-heptane added to have a turbidity of 10 NTU when n-heptane is added to the PGMEA solution containing this copolymer for lithography at 20 wt % with respect to a total mass of this PGMEA solution; and this turbidity Tm(80) is a turbidity of (Continued)

a PGMEA solution when methanol in an amount to be 80% of (X)m is added to this PGMEA solution where (X)m denotes an amount of methanol added to have a turbidity of 5.0 NTU when methanol is added to this PGMEA solution containing this copolymer for lithography at 20 wt % with respect to a total mass of this PGMEA solution.

9 Claims, 2 Drawing Sheets

(51) Int. Cl.
*G03F 7/004* (2006.01)
*G03F 7/16* (2006.01)
*G03F 7/20* (2006.01)
*G03F 7/32* (2006.01)
*C08F 2/04* (2006.01)
*C08F 220/68* (2006.01)
*C08F 220/18* (2006.01)
*C08F 2/06* (2006.01)
*C08F 2/00* (2006.01)

(52) U.S. Cl.
CPC .......... *G03F 7/0048* (2013.01); *G03F 7/0382* (2013.01); *G03F 7/0397* (2013.01); *G03F 7/16* (2013.01); *G03F 7/20* (2013.01); *G03F 7/32* (2013.01)

(56) References Cited

U.S. PATENT DOCUMENTS

| | | |
|---|---|---|
| 2010/0222526 A1 | 9/2010 | Oikawa et al. |
| 2012/0115086 A1 | 5/2012 | Yasuda et al. |

FOREIGN PATENT DOCUMENTS

| | | | |
|---|---|---|---|
| JP | 2003-280201 A | | 10/2003 |
| JP | 2008-292975 | | 12/2008 |
| JP | 2009-173749 A | | 8/2009 |
| JP | 2010-202699 A | | 9/2010 |
| JP | 2010-254810 | * | 11/2010 |
| JP | 2012-068471 | * | 4/2012 |
| JP | 2012-189982 | * | 10/2012 |
| JP | 2013-214032 A | | 10/2013 |
| JP | 2013-221125 A | | 10/2013 |
| WO | 2008/053877 A1 | | 5/2008 |
| WO | WO 2008/053877 | | 5/2008 |
| WO | WO 2008/081822 | | 7/2008 |
| WO | 2011/004840 A1 | | 1/2011 |
| WO | 2013/133250 A1 | | 9/2013 |

OTHER PUBLICATIONS

Non Final Office Action dated Jul. 21, 2015, in U.S. Appl. No. 14/382,476.
Final Office Action dated Jan. 21, 2016, in U.S. Appl. No. 14/382,476.
International Search Report dated May 28, 2013, in PCT/JP13/055923 filed Mar. 5, 2013.

* cited by examiner

COPOLYMER FOR SEMICONDUCTOR LITHOGRAPHY, RESIST COMPOSITION, AND METHOD FOR MANUFACTURING SUBSTRATE

TECHNICAL FIELD

The present invention relates to a copolymer for semiconductor lithography, a resist composition using the copolymer for semiconductor lithography, and a method for manufacturing a substrate on which a pattern is formed using the resist composition.

This application is based upon and claims the benefit of priority of the prior Japanese Patent Application No. 2013-182468 filed in Japan on Sep. 3, 2013 and the prior Japanese Patent Application No. 2013-182469 filed in Japan on Sep. 3, 2013, the entire contents of which are incorporated herein by reference.

BACKGROUND ART

In recent years, formation of finer patterns by lithography has been rapidly advanced in a manufacturing process of a semiconductor element, a liquid crystal element, and the like. As a method for forming a finer pattern, the wavelength of irradiating light is shortened.

Recently, a KrF excimer laser (wavelength: 248 nm) lithographic technique has been introduced, and an ArF excimer laser (wavelength: 193 nm) lithographic technique and an EUV (wavelength: 13.5 nm) lithographic technique have been investigated in order to further shorten the wavelength.

Acrylic copolymers that are transparent with respect to light having a wavelength of 193 nm have attracted attention as a copolymer for chemically amplified resist used in the ArF excimer laser lithography. For example, a copolymer for resist formed using a (meth)acrylic acid ester as a monomer is described in the following Patent Document 1.

However, it is general that a copolymer of a (meth)acrylic acid ester is polymerized by a radical polymerization method. Generally, in a copolymer of a multicomponent system composed of two or more kinds of monomers, the composition (copolymer composition) of the monomer units in the copolymer to be produced in an initial stage of polymerization differs from that in a later stage of polymerization since the copolymerization reactivity ratio among the respective monomers is different, and thus the copolymer to be obtained has a composition distribution.

There is a case in which the preparation of the resist composition is interfered as the solubility of the resist composition in a solvent is likely to be non-uniform so that the resist composition precipitates when being stored at a low temperature, it takes a long time to dissolve the resist composition in a solvent when being prepared, or the number of manufacturing processes increases due to the generation of insoluble matters when the composition of the monomer units in the copolymer varies. In addition, the sensitivity of the resist composition to be obtained is likely to be insufficient.

For example, a method for manufacturing a copolymer for photoresist is described in Patent Document 2 which includes a supply step of supplying a monomer solution and a solution containing a polymerization initiator to a polymerization reaction system in order to obtain a highly sensitive resist and in which the fluctuation of the composition of unreacted monomers present in the polymerization reaction system is small from the start of the polymerization reaction to the completion of supply of the monomer solution.

A method is described in Patent Document 3 in which a portion of the monomer having an acid leaving group among the monomers used in the manufacture of the copolymer for resist is supplied to a reaction vessel in advance and the rest of the monomer having an acid leaving group and a mixture of other monomers are added to the reaction vessel dropwise to polymerize them. In the dropping polymerization method, a copolymer having a higher molecular weight is produced in an initial stage of the polymerization reaction and a copolymer having a lower molecular weight is then produced as the polymerization reaction proceeds, and thus a copolymer in which an acid leaving group exhibiting low polarity is contained more on the higher molecular weight side to be produced in the initial stage of the polymerization is obtained by setting only the acid leaving group present in the reaction vessel in advance.

CITATION LIST

Patent Document

Patent Document 1: JP 2002-145955 A
Patent Document 2: JP 2010-202699 A
Patent Document 3: WO 2008/053877 A

DISCLOSURE OF THE INVENTION

Problem to be Solved by the Invention

However, there is a case in which the solubility of the copolymer for lithography or the sensitivity of the resist composition is not sufficiently improved by the methods described in Patent Documents 2 and 3.

More specifically, a copolymer solution is often stored at a place having a temperature lower than room temperature in order to prevent denaturation of the copolymer solution, but it cannot be often expected that the dissolution stability (namely, low temperature solubility) of the copolymer solution in that state is improved.

In addition, according to the knowledge of the present inventors, the copolymer obtained by the method described in Patent Document 3 exhibits significantly inferior solubility in a highly polar solvent.

The invention has been made in view of the above circumstances, and an object thereof is to provide a copolymer for lithography exhibiting favorable low temperature solubility, a resist composition using the copolymer for lithography, and a method for manufacturing a substrate on which a pattern is formed using the resist composition.

In addition, an object of the invention is to provide a copolymer for lithography which exhibits favorable solubility in a solvent and can improve the sensitivity when being used in a resist composition, a method for manufacturing the copolymer, a resist composition using the copolymer for lithography, and a method for manufacturing a substrate on which a pattern is formed using the resist composition.

Means for Solving Problem

An aspect of the invention relates to the following [1'] to [3'].

[1'] A copolymer for lithography, in which a turbidity Th(80) of a 20 wt % PGMEA solution of the copolymer for lithography measured under the following conditions of (1') to (8') is 4.6 NTU or less and a turbidity Tm(80) thereof is 3.8 NTU or less.

(1') A 20 wt % PGMEA solution of the copolymer for lithography is adjusted.

(2') An amount of n-heptane added (X)h to have a turbidity of 10 NTU when n-heptane is added to the PGMEA solution is determined.

(3') n-heptane in an amount to be 80% of the amount of n-heptane added that is determined in (2') above is added to a 20 wt % PGMEA solution of the copolymer for lithography, and the solution thus obtained is adjusted to 25° C. and stirred for 4 hours.

(4') A solution temperature of the solution obtained in (3') above is adjusted to 25° C., and a turbidity Th(80) of the solution is measured using a turbidity meter (TB200 manufactured by Orbeco-Hellige, Inc).

(5') A 20 wt % PGMEA solution of the copolymer for lithography is adjusted.

(6') An amount of methanol added (X)m to have a turbidity of 5.0 NTU when methanol is added to the PGMEA solution is determined.

(7') Methanol in an amount to be 80% of the amount of methanol added that is determined in (6') above is added to a 20 wt % PGMEA solution of the copolymer for lithography, and the solution thus obtained is adjusted to 25° C. and stirred for 4 hours.

(8') A solution temperature of the solution obtained in (7') above is adjusted to 25° C., and a turbidity Tm(80) of the solution is measured using a turbidity meter (TB200 manufactured by Orbeco-Hellige, Inc).

[2'] A resist composition containing the copolymer for lithography according to [1'] and a compound which generates an acid by irradiation of an actinic ray or radiation.

[3'] A method for manufacturing a substrate having a pattern formed thereon, the method including a step of coating the resist composition according to [2'] on a substrate to be processed, a step of exposing the substrate to light having a wavelength of 250 nm or less, and a step of developing the substrate using a developing solution.

Another aspect of the invention relates to the following [1"] to [3"].

[1"] A copolymer for lithography obtained by polymerizing at least one kind of monomer containing an acid leaving group and at least one kind of monomer which does not contain an acid leaving group, in which $N(v_1)/N_{ave}$ is from 1.01 to 1.09 where a ratio of a monomer unit containing an acid leaving group among total monomer units constituting a copolymer contained in a first fraction that is most previously eluted among five fractions of an eluate divided in order of elution so as to have an equal volume, the eluate providing a peak attributed to the copolymer in an elution curve obtained by gel permeation chromatography (GPC), is denoted as $N(v_1)$ mol %, ratios of monomer units containing an acid leaving group among total monomer units constituting copolymers contained in the respective fractions which are eluted from secondly to fourthly are denoted as $N(v_2)$ mol %, $N(v_3)$ mol %, and $N(v_4)$ mol %, respectively, and a ratio of a monomer unit containing an acid leaving group among total monomer units constituting copolymers contained in a sum of the five fractions is denoted as Nave mol %; and a turbidity Th(80) of a 20 wt % PGMEA solution of the copolymer for lithography measured under the following conditions is 4.7 NTU or less and a turbidity Tm(80) thereof is 3.9 NTU or less.

Conditions for measuring turbidity Th(80)

(1") A 20 wt % PGMEA solution of the copolymer for lithography is adjusted.

(2") An amount of n-heptane added (X)h to have a turbidity of 10 NTU when n-heptane is added to the PGMEA solution is determined.

(3") n-heptane in an amount to be 80% of the amount of n-heptane added that is determined in (2") above is added to a 20 wt % PGMEA solution of the copolymer for lithography, and the solution thus obtained is adjusted to 25° C. and stirred for 4 hours.

(4") A solution temperature of the solution obtained in (3") above is adjusted to 25° C., and a turbidity Th(80) of the solution is measured using a turbidity meter (TB200 manufactured by Orbeco-Hellige, Inc).

Conditions for measuring turbidity Tm(80)

(5") A 20 wt % PGMEA solution of the copolymer for lithography is adjusted.

(6") An amount of methanol added (X)m to have a turbidity of 5.0 NTU when methanol is added to the PGMEA solution is determined.

(7") Methanol in an amount to be 80% of the amount of methanol added that is determined in (6") above is added to a 20 wt % PGMEA solution of the copolymer for lithography, and the solution thus obtained is adjusted to 25° C. and stirred for 4 hours.

(8") A solution temperature of the solution obtained in (7") above is adjusted to 25° C., and a turbidity Tm(80) of the solution is measured using a turbidity meter (TB200 manufactured by Orbeco-Hellige, Inc).

[2"] A method for manufacturing a resist composition, the method including a step of mixing the polymer for lithography and a compound which generates an acid by irradiation of an actinic ray or radiation.

[3"] A method for manufacturing a substrate having a pattern formed thereon, the method including a step of coating the resist composition on a substrate to be processed, a step of exposing the substrate to light having a wavelength of 250 nm or less, and a step of developing the substrate using a developing solution.

Still another aspect of the invention relates to the following.

[1] A copolymer for lithography having a turbidity Th(80) of 1.0 NTU or more and 4.6 NTU or less and a turbidity Tm(80) of 1.0 NTU or more and 3.8 NTU or less, in which the turbidity Th(80) is a turbidity of a PGMEA solution when n-heptane in an amount to be 80% of (X)h is added to the PGMEA solution where (X)h denotes an amount of n-heptane added to have a turbidity of 10 NTU when n-heptane is added to the PGMEA solution containing the copolymer for lithography at 20 wt % with respect to a total mass of the PGMEA solution; and the turbidity Tm(80) is a turbidity of a PGMEA solution when methanol in an amount to be 80% of (X)m is added to the PGMEA solution where (X)m denotes an amount of methanol added to have a turbidity of 5.0 NTU when methanol is added to the PGMEA solution containing the copolymer for lithography at 20 wt % with respect to a total mass of the PGMEA solution.

[2] The copolymer for lithography according to [1], in which the copolymer for lithography contains an acid leaving group.

[3] A copolymer for lithography obtained by polymerizing at least one kind of monomer containing an acid leaving group and at least one kind of monomer which does not contain an acid leaving group, in which N(v1)/Nave of the copolymer for lithography is from 1.01 to 1.09, a turbidity Th(80) is 1.0 NTU or more and 4.7 NTU or less, and a turbidity Tm(80) is 1.0 NTU or more and 3.9 NTU or less, in which N(v1)/Nave is a numerical value obtained by dividing N(v1) by Nave where a ratio of the number of moles of a constitutional unit containing an acid leaving group with respect to the number of total moles of constitutional units constituting a copolymer contained in a first fraction that is most previously eluted among five fractions of an eluate divided in order of elution so as to have equal volumes, the eluate providing a peak attributed to the copolymer in an elution curve obtained by gel permeation chromatography (GPC), is denoted as $N(v_1)$ mol % and a ratio of the number of moles of a constitutional unit containing an acid leaving group with respect to the number of total moles of constitutional units constituting the copolymers contained in all of the five fractions is denoted as $N_{ave}$ mol %;

the turbidity Th(80) is a turbidity of a PGMEA solution when n-heptane in an amount to be 80% of (X)h is added to the PGMEA solution where (X)h denotes an amount of n-heptane added to have a turbidity of 10 NTU when n-heptane is added to the PGMEA solution containing the copolymer for lithography at 20 wt % with respect to a total mass of the PGMEA solution; and the turbidity Tm(80) is a turbidity of a PGMEA solution when methanol in an amount to be 80% of (X)m is added to the PGMEA solution where (X)m denotes an amount of methanol added to have a turbidity of 5.0 NTU when methanol is added to the PGMEA solution containing the copolymer for lithography at 20 wt % with respect to a total mass of the PGMEA solution.

[4] The copolymer for lithography according to [2] or [3], in which the acid leaving group is a (meth)acrylic acid ester residue having a tertiary carbon atom at a bonding site with a (meth)acryloyl oxy group.

[5] The copolymer for lithography according to any one of [2] to [4], in which the constitutional unit having an acid leaving group is at least one kind of constitutional unit selected from the group consisting of constitutional units represented by the following Formulas (i) to (iv):

[Chem. 1]

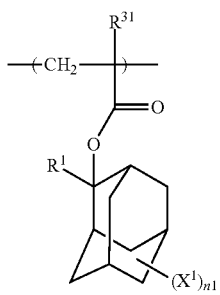

(i)

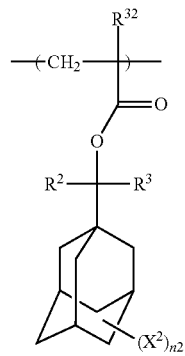

(ii)

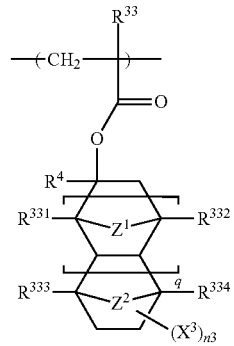

(iii)

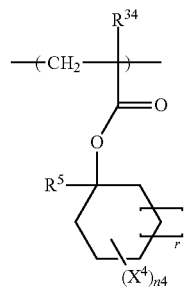

(iv)

(in Formulas (i) to (iv), $R^{31}$, $R^{32}$, $R^{33}$, and $R^{34}$ each independently represent a hydrogen atom or a methyl group; $R^1$, $R^4$, and $R^5$ each independently represent an alkyl group having from 1 to 5 carbon atoms; $R^2$ and $R^3$ each independently represent an alkyl group having from 1 to 3 carbon atoms; $X^1$, $X^2$, $X^3$, and $X^4$ each independently represent an alkyl group having from 1 to 6 carbon atoms; n1, n2, n3, and n4 each independently represent an integer from 0 to 4; a plurality of $X^1$, $X^2$, $X^3$, or $X^4$ are present in one constitutional unit in a case in which n1, n2, n3, or n4 is 2 or more, and the plurality of $X^1$, $X^2$, $X^3$, and $X^4$ may be the same as or different from one another; $R^{331}$, $R^{332}$, $R^{333}$, and $R^{334}$ each independently represent a hydrogen atom or an alkyl group having from 1 to 6 carbon atoms; $Z^1$ and $Z^2$ each independently represent —O—, —S—, —NH—, or an alkylene group having from 1 to 6 carbon atoms; q represents 0 or 1; and r represents an integer from 0 to 2).

[6] The copolymer for lithography according to any one of [2] to [5], further comprising a constitutional unit having a lactone skeleton.

[7] The copolymer for lithography according to any one of [2] to [6], further comprising a constitutional unit having at least one group selected from the group consisting of a group represented by —C(CF$_3$)$_2$—OH, a hydroxyl group, a cyano group, a methoxy group, a carboxy group, and an amino group.

[8] A resist composition containing the copolymer for lithography according to any one of [1] to [7] and a compound which generates an acid by irradiation of an actinic ray or radiation.

[9] A method for manufacturing a substrate having a pattern formed thereon, the method including a step of coating the resist composition according to [8] on a substrate to be processed, a step of exposing the substrate to light having a wavelength of 250 nm or less, and a step of developing the substrate using a developing solution.

Effect of the Invention

The copolymer for lithography of the invention exhibits excellent solubility in a solvent, favorable solubility (low temperature solubility) in a solvent particularly at a low temperature, and uniform solubility in a developing solution when being used in a resist composition so that high sensitivity is obtained.

The resist composition obtained by the manufacturing method of the invention is a chemically amplified type and exhibits excellent solubility in a resist solvent and excellent sensitivity. In addition, the resist composition obtained by the manufacturing method of the invention exhibits excellent solubility in a resist solvent at a low temperature.

According to the method for manufacturing a substrate of the invention, it is possible to stably form a highly precise fine resist pattern.

MODE(S) FOR CARRYING OUT THE INVENTION

Figure 1:
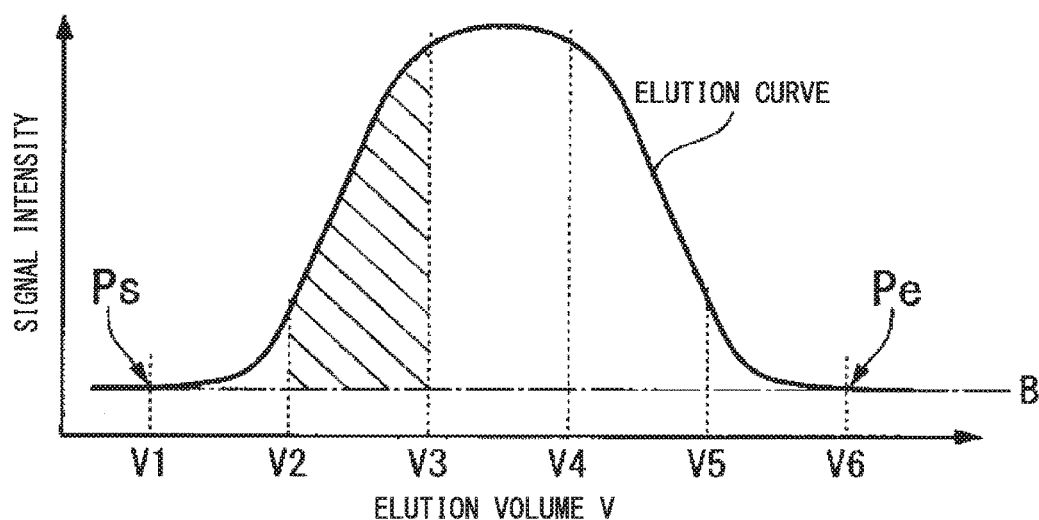
FIG. 1 is a diagram for describing an elution curve obtained by gel permeation chromatography (GPC)

In the present specification, the term "(meth)acrylate" means an acrylate or a methacrylate, the term "(meth)acrylic acid" means acrylic acid or methacrylic acid, and the term "(meth)acryloyloxy" means acryloyloxy or methacryloyloxy.

In addition, the term "low temperature" means a "temperature of 20° C. or higher and lower than 25° C.".

In addition, the term "PGMEA" means propylene glycol monomethyl ether acetate.

In addition, the term "dissolution" means that fine particles are uniformly dispersed in a liquid so as to be in a state of not being settled.

The term "solution" means a visually transparent liquid in which fine particles are uniformly dispersed so as to be in a state of not being settled.

The "weight average molecular weight (Mw)" and "molecular weight distribution (Mw/Mn)" of a copolymer in the invention mean values determined by gel permeation chromatography (GPC) in terms of polystyrene.

First Embodiment

<Copolymer for Lithography>

The copolymer for lithography of an embodiment of the invention is a copolymer for lithography having a turbidity Th(80) of 1.0 NTU or more and 4.6 NTU or less and a turbidity Tm(80) of 1.0 NTU or more and 3.8 NTU or less.

The turbidity Th(80) is a turbidity of a PGMEA solution when n-heptane in an amount to be 80% of (X)h is added to the PGMEA solution where (X)h denotes an amount of n-heptane added to have a turbidity of 10 NTU when n-heptane is added to the PGMEA solution containing the copolymer for lithography at 20 wt % with respect to a total mass of the PGMEA solution.

The turbidity Tm(80) is a turbidity of a PGMEA solution when methanol in an amount to be 80% of (X)m is added to the PGMEA solution where (X)m denotes an amount of methanol added to have a turbidity of 5.0 NTU when methanol is added to the PGMEA solution containing the copolymer for lithography at 20 wt % with respect to a total mass of the PGMEA solution.

The turbidity can be measured under the following conditions (1) to (8).

The term "NTU" is an abbreviation for Nephelometric Turbidity Unit and means the turbidity unit using formazin as the turbidity standard solution.

(1) The PGMEA solution in which the content of the copolymer for lithography is 20 wt % with respect to the total mass of the PGMEA solution is adjusted. The PGMEA solution can be adjusted by adding the copolymer for lithography to a PGMEA solution and stirring the solution, for example, for 2 hours at 25° C. and a rotational number of 60 rpm.

(2) The amount of n-heptane added (X)h (mass %, the amount of n-heptane added with respect to the total mass of the PGMEA solution) to have a turbidity of 10 NTU when n-heptane is added to the PGMEA solution is determined.

(3) n-heptane in an amount to be 80% of the amount of n-heptane added that is determined in (2) above is added to the PGMEA solution adjusted in (1) above, and the solution is adjusted to 25° C. and stirred for 4 hours at a rotational number of 60 rpm.

(4) The solution temperature of the solution obtained in (3) above is adjusted to 25° C., and the turbidity of the solution is measured, and the value thus obtained is adopted as the turbidity Th(80). The turbidity can be measured, for example, using a turbidity meter (TB200 manufactured by Orbeco-Hellige, Inc).

(5) The PGMEA solution in which the content of the copolymer for lithography is 20 wt % with respect to the total mass of the PGMEA solution is adjusted. The PGMEA solution can be adjusted by adding the copolymer for lithography to a PGMEA solution and stirring the solution, for example, for 2 hours at 25° C. and a rotational number of 60 rpm.

(6) The amount of methanol added (X)m (mass %, the amount of n-heptane added with respect to the total mass of the PGMEA solution) to have a turbidity of 5.0 NTU when methanol is added to the PGMEA solution is determined.

(7) Methanol in an amount to be 80% of the amount of methanol added that is determined in (6) above is added to the PGMEA solution adjusted in (5) above, and the solution is adjusted to 25° C. and stirred for 4 hours at a rotational number of 60 rpm.

(8) The solution temperature of the solution obtained in (7) above is adjusted to 25° C., and the turbidity of the solution is measured, and the value thus obtained is adopted as the turbidity Tm(80). The turbidity can be measured, for example, using a turbidity meter (TB200 manufactured by Orbeco-Hellige, Inc).

A copolymer for lithography which satisfies the above conditions exhibits favorable low temperature solubility in a solvent.

As the copolymer for lithography of an embodiment of the invention, a copolymer used in the lithographic process can be applied without being particularly limited.

Examples thereof may include a copolymer for positive or negative type resist used in the formation of a positive or negative type resist film; a copolymer for antireflective coating used for the formation of an antireflective coating (TARC) formed on the upper layer of the resist film or an antireflective coating (BARC) formed on the lower layer of the resist film; a copolymer for gap fill layer used for the formation of a gap fill layer; and a copolymer for topcoat film used for the formation of a topcoat film.

Examples of the copolymer for resist may include a copolymer containing at least one kind of constitutional unit having acid leaving group and at least one kind of constitutional unit having a polar group.

Examples of the copolymer for antireflective coating may include a copolymer containing a constitutional unit having a light absorbent group; and a constitutional unit having a reactive functional group that is curable by the reaction with a curing agent or the like in order to avoid mixing with the resist film.

Here, the term "light absorbent group" refers to a group exhibiting high absorption performance with respect to light in a wavelength region in which the sensitive component in the resist composition exhibits sensitivity, and specific examples thereof may include a group having a cyclic structure (which may have an arbitrary substituent) such as an anthracene ring, a naphthalene ring, a benzene ring, a quinoline ring, a quinoxaline ring, or a thiazole ring. In particular, an unsubstituted anthracene ring or an anthracene ring having an arbitrary substituent is preferable in the case of using KrF laser beam as the irradiating light, and an unsubstituted benzene ring or a benzene ring having an arbitrary substituent is preferable in the case of using ArF laser beam as the irradiating light.

Examples of the arbitrary substituent may include a phenolic hydroxyl group, an alcoholic hydroxyl group, a carboxy group, a carbonyl group, an ester group, an amino group, or an amide group.

Among these, a substituent having a phenolic hydroxyl group that is protected or not protected is preferable as the light absorbent group from the viewpoint of favorable developability and high resolution.

Examples of the constitutional unit and the monomer which have a light absorbent group may include benzyl (meth)acrylate and p-hydroxyphenyl (meth) acrylate.

Specific examples of the reactive functional group that is curable by the reaction with a curing agent or the like may include an amino group, an amido group, a hydroxyl group, and an epoxy group, and examples of the constitutional unit and the monomer which have these may include 2-hydroxyethyl(meth)acrylate and 2-hydroxy-n-propyl (meth)acrylate.

Examples of the copolymer for gap fill layer may include a copolymer which has an appropriate viscosity required in order to flow into a narrow gap and contains a constitutional unit having a reactive functional group that is curable by the reaction with a curing agent or the like in order to avoid mixing with the resist film or the antireflective coating, and specific examples thereof may include a copolymer of monomers of hydroxystyrene and styrene, an alkyl(meth) acrylate, a hydroxyalkyl(meth)acrylate or the like.

Examples of the copolymer for topcoat film used in the immersion lithography may include a copolymer containing a constitutional unit having a carboxyl group and a copolymer containing a constitutional unit having a fluorine-containing group that is substituted with a hydroxyl group.

<Copolymer for Resist>

Hereinafter, the invention will be described with reference to a copolymer for resist (hereinafter, simply referred to as the copolymer in some cases) as a representative example of the copolymer for lithography, but it is also applicable as another copolymer for lithography.

As the copolymer for resist, a copolymer which is used in the formation of a resist film can be applied without being particular limited.

Specifically, a copolymer for resist containing at least one kind of constitutional unit having acid leaving group and at least one kind of constitutional unit having a polar group is preferable. The copolymer for resist is obtained by polymerizing a monomer mixture composed of at least one kind of monomer having acid leaving group and at least one kind of monomer having a polar group.

[Constitutional Unit and Monomer having an Acid Leaving Group]

The term "acid leaving group" is a group having a bond that is cleaved by an acid, and it is a group of which a part or whole of the acid leaving groups is eliminated from the main chain of a copolymer by cleavage of the bond.

The copolymer containing a constitutional unit having an acid leaving group is soluble in an alkaline solution by an acid so as to have an action that enables the formation of a resist pattern in the case of being used as a resist composition. The content of the constitutional unit having an acid leaving group is preferably 20 mol % or more and more preferably 25 mol % or more with respect to the number of total moles of the constitutional units constituting the copolymer from the viewpoint of sensitivity and resolution. In addition, it is preferably 60 mol % or less, more preferably 55 mol % or less, and even more preferably 50 mol % or less with respect to the number of total moles of the constitutional units constituting the copolymer from the viewpoint of adhesion to a substrate and the like.

In other words, the content of the constitutional unit having an acid leaving group is preferably 20 mol % or more and 60 mol % or less, more preferably 25 mol % or more and 60 mol % or less, even more preferably 25 mol % or more and 55 mol % or less, and even more preferably 25 mol % or more and 50 mol % or less with respect to the number of total moles of the constitutional units constituting the copolymer.

The weight average molecular weight (Mw) of the copolymer for resist is preferably from 1,000 to 100,000 and more preferably from 3,000 to 30,000. The molecular weight distribution (Mw/Mn) thereof is preferably from 1.0 to 3.0, more preferably from 1.1 to 2.5, and even more preferably from 1.1 to 1.7.

The monomer having an acid leaving group may be a compound having an acid cleavable group and a polymerizable multiple bond, and a known monomer can be used. The polymerizable multiple bond is a multiple bond that is cleaved at the time of the polymerization reaction to form a copolymer chain, and an ethylenic double bond is preferable.

Specific examples of the monomer having an acid leaving group may include a (meth)acrylic acid ester having an alicyclic hydrocarbon group having from 6 to 20 carbon atoms and an acid leaving group. The alicyclic hydrocarbon group may be directly bonded to the oxygen atom constituting the ester bond of a (meth)acrylic acid ester or may be bonded thereto via a linking group such as an alkylene group.

Examples of the alicyclic hydrocarbon group having from 6 to 20 carbon atoms may include 2-methyl-2-adamantyl, 2-ethyl-2-adamantyl, 2-isopropyl-2-adamantyl, 1-(1'-adamantyl)-1-methylethyl, 1-methylcyclohexyl, 1-ethylcyclohexyl, 1-methylcyclopentyl, 1-ethylcyclopentyl, 1-isopropylcyclopentyl, and 1-t-butylcyclopentyl.

The (meth)acrylic acid ester may include a (meth)acrylic acid ester which has an alicyclic hydrocarbon group having from 6 to 20 carbon atoms and a tertiary carbon atom at the bonding site with the oxygen atom constituting the ester bond of a (meth)acrylic acid ester or a (meth)acrylic acid ester which has an alicyclic hydrocarbon group having from 6 to 20 carbon atoms and a —COOR group (R represents a tertiary hydrocarbon group, a tetrahydrofuranyl group, a tetrahydropyranyl group, or an oxepanyl group which may have a substituent) bonded to the alicyclic hydrocarbon group directly or via a linking group.

The oxygen atom of an ester is bonded to a tertiary carbon atom, and thus the (meth)acrylic acid ester is soluble in a developing solution at the time of alkali development as it is decomposed by an acid generated by an acid generator and eliminated to produce a carboxyl group.

Preferred examples of the constitutional unit that is a monomer having an acid leaving group and derived from a (meth)acrylic acid ester having an alicyclic hydrocarbon group having from 6 to 20 carbon atoms and an acid leaving group may include constitutional units represented by the following Formulas (i) to (iv).

[Chem. 2]

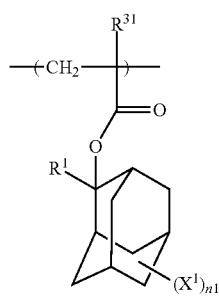

(i)

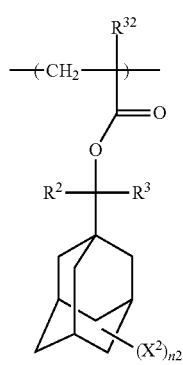

(ii)

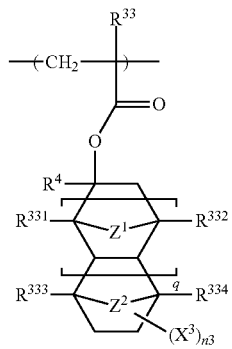

(iii)

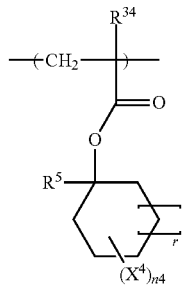

(iv)

In Formulas (i) to (iv), $R^{31}$, $R^{32}$, $R^{33}$, and $R^{34}$ each independently represent a hydrogen atom or a methyl group.

$R^1$, $R^4$, and $R^5$ each independently represent an alkyl group having from 1 to 5 carbon atoms. The alkyl group may be linear or branched.

$R^2$ and $R^3$ each independently represent an alkyl group having from 1 to 3 carbon atoms. The alkyl group may be linear or branched.

$X^1$, $X^2$, $X^3$, and $X^4$ each independently represent an alkyl group having from 1 to 6 carbon atoms. The alkyl group may be linear or branched.

n1, n2, n3, and n4 each independently represent an integer from 0 to 4. A plurality of $X^1$, $X^2$, $X^3$, or $X^4$ are present in one constitutional unit in a case in which n1, n2, n3, or n4 is 2 or more. The plurality of $X^1$, $X^2$, $X^3$, and $X^4$ may be the same as or different from one another.

In Formula (iii), $R^{331}$, $R^{332}$, $R^{333}$, and $R^{334}$ each independently represent a hydrogen atom or an alkyl group having from 1 to 6 carbon atoms. The alkyl group may be linear or branched.

In Formula (iii), $Z^1$ and $Z^2$ each independently represent —O—, —S—, —NH—, or an alkylene group having from 1 to 6 carbon atoms. The "methylene group having from 1 to 6 carbon atoms" is a divalent group represented by —$(CH_2)_k$— (k is an integer from 1 to 6). In Formula (iii), q represents 0 or 1.

In Formula (iv), r represents an integer from 0 to 2.

Particularly, in the case of manufacturing a resist composition applied to a pattern forming method to expose to light having a wavelength of 250 nm or less, preferred examples of the monomer having an acid leaving group may include 2-methyl-2-adamantyl(meth)acrylate, 2-ethyl-2-adamantyl(meth)acrylate, 2-isopropyl-2-adamantyl(meth)acrylate, 1-(1'-adamantyl)-1-methylethyl(meth)acrylate, 1-methylcyclohexyl(meth)acrylate, 1-ethyl-cyclohexyl(meth)acrylate, 1-methyl-cyclopentyl(meth)acrylate, 1-ethylcyclopentyl(meth)acrylate, 1-isopropylcyclopentyl(meth)acrylate, 1-t-butylcyclopentyl(meth)acrylate, isopropyladamantyl(meth)acrylate, and 1-ethylcyclooctyl(meth)acrylate.

Among these, 1-ethylcyclohexyl methacrylate, 2-methyl-2-adamantyl methacrylate, 2-ethyl-2-adamantyl methacrylate, 1-ethylcyclopentyl methacrylate, and isopropyladamantyl methacrylate are more preferable.

The monomer having an acid leaving group may be used singly or in combination of two or more kinds thereof.

[Constitutional Unit and Monomer having Polar Group]

The "polar group" is a group having a functional group exhibiting polarity or an atomic group exhibiting polarity, and specific examples thereof may include a hydroxyl group, a cyano group, an alkoxy group, a carboxy group, an amino group, a carbonyl group, a group containing a fluorine atom, a group containing a sulfur atom, a group containing a lactone skeleton, a group containing an acetal structure, and a group containing an ether bond.

Among these, a copolymer for resist applied to a pattern forming method to expose to light having a wavelength of 250 nm or less preferably has a constitutional unit having a lactone skeleton as the constitutional unit having a polar group and preferably further has a constitutional unit having a hydrophilic group to be described later.

(Constitutional Unit and Monomer Having Lactone Skeleton)

Examples of the lactone skeleton may include a lactone skeleton of about from 4 to 20 membered ring. The lactone skeleton may be a monocycle composed of only a lactone ring or those in which an aliphatic or aromatic carbocycle or heterocycle is condensed to a lactone ring. In a case in which the copolymer contains a constitutional unit having a lactone skeleton, the content thereof is preferably 20 mol % and more preferably 35 mol % or more when the total constitutional units of the copolymer is set to 100 mol % from the viewpoint of adhesion to a substrate and the like. In addition, the content is preferably 60 mol % or less, more preferably 55 mol % or less, and even more preferably 50 mol % or less from the viewpoint of sensitivity and resolution.

In other words, the content of the constitutional unit having a lactone skeleton is preferably 20 mol % or more and 60 mol % or less, more preferably 20 mol % or more and 55 mol % or less, even more preferably 35 mol % or more and 55 mol % or less, and even more preferably 35 mol % or more and 50 mol % or less when the total constitutional units of the copolymer is set to 100 mol %.

As the monomer having a lactone skeleton, at least one kind selected from the group consisting of a (meth)acrylic acid ester having a substituted or unsubstituted δ-valerolactone ring and a monomer having a substituted or unsubstituted γ-butyrolactone ring is preferable and a monomer having an unsubstituted γ-butyrolactone ring is even more preferable from the viewpoint of excellent adhesion to a substrate and the like.

Specific examples of the monomer having a lactone skeleton may include β-(meth)acryloyloxy-β-methyl-δ-valerolactone, 4,4-dimethyl-2-methylene-γ-butyrolactone, β-γ-butyrolactone(meth)acrylate, β-(meth)acryloyloxy-β-methyl-γ-butyrolactone, α-γ-butyrolactone(meth)acrylate, 2-(1-(meth)acryloyloxy)ethyl-4-butanolide, (meth)acrylic acid pantoyllactone, 5-(meth)acryloyloxy-2,6-norbornanecarbolactone, 8-methacryloxy-4-oxatricyclo[5.2.1.0$^{2,6}$]decane-3-one, and 9-methacryloxy-4-oxytricyclo[5.2.1.0$^{2,6}$]decane-3-one. In addition, examples of a monomer having a similar structure may include methacryloyloxy succinic anhydride.

The monomer having a lactone skeleton may be used singly or in combination of two or more kinds thereof.

(Constitutional Unit and Monomer having Hydrophilic Group)

Examples of the "hydrophilic group" in the present specification may include at least one kind of group selected from the group consisting of a group represented by —C(CF$_3$)$_2$—OH, a hydroxyl group, a cyano group, a methoxy group, a carboxy group, and an amino group.

Among these, a copolymer for resist applied to a pattern forming method to expose to light having a wavelength of 250 nm or less preferably has at least one kind of group selected from the group consisting of a hydroxyl group and a cyano group as a hydrophilic group.

The content of the constitutional unit having a hydrophilic group in the copolymer is preferably from 5 to 30 mol % and more preferably from 10 to 25 mol % when the total constitutional units constituting the copolymer is set to 100 mol % from the viewpoint of the resist pattern rectangularity.

Examples of the monomer having a hydrophilic group may include a (meth)acrylic acid ester having a terminal hydroxyl group; a derivative having a substituent such as an alkyl group, a hydroxyl group, or a carboxy group on the hydrophilic group of the monomer; and a monomer in which a monomer having a cyclic hydrocarbon group (for example, cyclohexyl(meth)acrylate, 1-isobornyl(meth)acrylate, adamantyl(meth)acrylate, tricyclodecanyl(meth)acrylate, dicyclopentyl(meth)acrylate, 2-methyl-2-adamantyl(meth)acrylate, or 2-ethyl-2-adamantyl(meth)acrylate) has a hydrophilic group such as a hydroxyl group or a carboxy group as a substitute.

Specific examples of the monomer having a hydrophilic group may include (meth)acrylic acid, 2-hydroxyethyl(meth)acrylate, 3-hydroxypropyl(meth)acrylate, 2-hydroxy-n-propyl(meth)acrylate, 4-hydroxybutyl(meth)acrylate, 3-hydroxy-1-adamantyl(meth)acrylate, 2- or 3-cyano-5-norbornyl(meth)acrylate, and 2-cyanomethyl-2-adamantyl(meth)acrylate. From the viewpoint of adhesion to a substrate and the like, 3-hydroxy-1-adamantyl(meth)acrylate, 2- or 3-cyano-5-norbornyl(meth)acrylate, and 2-cyanomethyl-2-adamantyl(meth)acrylate are preferable.

The monomer having a hydrophilic group may be used singly or in combination of two or more kinds thereof.

<Method for Manufacturing Copolymer=

[Polymerization Initiator]

In the polymerization using a polymerization initiator, a radical of the polymerization initiator is generated in the reaction solution and the sequential polymerization of the monomer starts by this radical and proceeds. The polymerization initiator used in the manufacture of the copolymer for resist of the invention is preferably a polymerization initiator which efficiently generates a radical by heat, and it is preferable to use a polymerization initiator of which the 10-hour half-life temperature is equal to or lower than the polymerization temperature of the copolymer for lithography. For example, a preferred polymerization temperature in the case of manufacturing a copolymer for lithography is from 50 to 150° C., and thus it is preferable to use a polymerization initiator of which the 10-hour half-life temperature is from 50 to 70° C. as the polymerization initiator. In addition, it is preferable that the difference between the 10-hour half-life temperature and the polymerization temperature is preferably 10° C. or more and 60° C. or less in order to efficiently decompose the polymerization initiator.

Examples of the polymerization initiator may include an azo compound such as 2,2'-azobisisobutyronitrile, dimethyl-2,2'-azobisisobutyrate, 2,2'-azobis(2,4-dimethylvaleronitrile), or 2,2'-azobis[2-(2-imidazolin-2-yl)propane]; an organic peroxide such as 2,5-dimethyl-2,5-bis(tert-butylperoxy)hexane or di(4-tert-butylcyclohexyl)peroxydicarbonate. As the polymerization initiator, an azo compound is more preferable. From the viewpoint of excellent solubility in a solvent and of being able to be suitably used in the solution polymerization, dimethyl-2,2'-azobisisobutyrate is even more preferable.

[Solvent]

In the method for manufacturing the copolymer of an embodiment of the invention, a polymerization solvent may be used or may not be used.

Examples of the polymerization solvent may include the following solvents.

Ethers: a chain ether (for example, diethyl ether and propylene glycol monomethyl ether), a cyclic ether (for example, tetrahydrofuran (hereinafter, referred to as "THF" in some cases) and 1,4-dioxane), and the like.

Esters: methyl acetate, ethyl acetate, butyl acetate, ethyl lactate, butyl lactate, propylene glycol monomethyl ether acetate (hereinafter, referred to as "PGMEA" in some cases), γ-butyrolactone, and the like.

Ketones: acetone, methyl ethyl ketone, methyl isobutyl ketone, and the like.

Amides: N,N-dimethylacetamide, N,N-dimethylformamide, and the like.

Sulfoxides: dimethyl sulfoxide and the like.

Aromatic hydrocarbons: benzene, toluene, xylene, and the like.

Aliphatic hydrocarbons: hexane and the like.

Alicyclic hydrocarbons: cyclohexane and the like.

The polymerization solvent may be used singly or two or more kinds thereof may be used concurrently.

The amount of the polymerization solvent used is not particularly limited, but for example, it is preferably an amount in which the concentration of solid substance in the liquid (namely, the polymerization reaction mixture) in the reactor at the time of the completion of the polymerization reaction becomes about from 20 to 40 mass % with respect to the total mass of the polymerization reaction mixture.

[Method for Manufacturing Copolymer for Lithography]

Hereinafter, a method for manufacturing a copolymer for resist will be described as a representative example of a method for manufacturing a copolymer for lithography, but it is also applicable to another copolymer for lithography in the same manner.

The copolymer for resist can be obtained by a radical polymerization method. The polymerization method is not particularly limited, and it is possible to appropriately use a known method such as a bulk polymerization method, a solution polymerization method, a suspension polymerization method, or an emulsion polymerization method.

In particular, a solution radical polymerization method is preferable from the viewpoint of easily carrying out a step of removing the monomer remaining after completion of the polymerization reaction in order not to lower the light transmittance and of relatively easily lowering the molecular weight of the copolymer. Among them, a dropping polymerization method is even more preferable from the viewpoint of decreasing variation of the average molecular weight, the molecular weight distribution, and the like due to the difference in production lot and of simply obtaining a reproducible copolymer.

In the dropping polymerization method, the inside of the polymerization vessel is heated to a predetermined polymerization temperature, and the monomer and the polymerization initiator are then each independently or in an arbitrary combination added to the polymerization vessel dropwise. The monomer may be added dropwise only as a monomer, or may be added dropwise as a monomer solution obtained by dissolving the monomer in a solvent. The solvent may be charged in the polymerization vessel in advance or may not be. In the case of not charging the solvent in the polymerization vessel in advance, the monomer or the polymerization initiator is added to the polymerization vessel dropwise in the absence of solvent.

The polymerization initiator may be dissolved directly in the monomer, in the monomer solution, or only in a solvent. The monomer and the polymerization initiator may be mixed in the same storage tank and then added to the polymerization vessel dropwise, or each of them may be added from an independent tank to the polymerization vessel dropwise.

In addition, they may be mixed together immediately before being supplied from independent tanks to the polymerization vessel and then added to the polymerization vessel dropwise.

One of the monomer and the polymerization initiator may be first added dropwise and the other may be later added dropwise, or both of them may be added dropwise at the same time.

Incidentally, the dropwise addition speed may be constant until the dropwise addition is completed, or it may be changed in multiple stages depending on the consumption speed of the monomer or the polymerization initiator. The dropwise addition may be conducted continuously or intermittently.

In addition, a purification step may be appropriately provided. Examples of the purification method may include a method (reprecipitation) in which the reaction mixture after completion of the polymerization is charged in a poor solvent to precipitate and recover the copolymer, a method (re-slurry) in which the precipitate recovered by reprecipitation is charged in a poor solvent again to produce the copolymer, and a method (re-reprecipitation) in which the precipitate recovered by reprecipitation is dissolved in a good solvent and then charged again in a poor solvent to precipitate and recover the copolymer. These may be used singly or in combination of a plurality of them.

In addition, the copolymer may be obtained as a mixture of two or more kinds of copolymers which are manufactured separately.

Hereinafter, an embodiment of the method for manufacturing a copolymer of the invention will be described.

The method for manufacturing a copolymer of an embodiment of the invention include a polymerization step of supplying a polymerization initiator and two or more kinds of monomers in a reactor to obtain a copolymer (P). For example, monomers $\alpha 1$ to $\alpha n$ are polymerized to obtain a copolymer composed of constitutional units $\alpha' 1$ to $\alpha' n$. The constitutional units $\alpha' 1$ to $\alpha' n$ represent the constitutional units derived from the monomers $\alpha 1$ to $\alpha n$, respectively. n represents an integer 2 or more and 15 or less. The monomers $\alpha 1$ to $\alpha n$ include at least one kind of monomer which contains an acid leaving group and at least one kind of monomer which does not contain an acid leaving group.

In an embodiment of the invention, the polymerization step is carried out by a radical polymerization method, and a dropping polymerization method is used in which the polymerization is conducted in the reactor while adding a monomer and a polymerization initiator to the reactor dropwise.

In other words, the manufacturing method includes a polymerization step of polymerizing two or more kinds of monomers $\alpha 1$ to $\alpha n$ in a reactor while adding the monomers and a polymerization initiator to the reactor to obtain a copolymer composed of the constitutional units α'1 to α'n.

In an embodiment of the invention, a solution Sa containing a monomer (a is 1 to d, and d is an integer 1 or more) and a solution Tb containing a monomer (b is 1 to e, and e is an integer 1 or more) are used. It is preferable that the solution Sa and the solution Tb contain a solvent.

[Solution Tb]

The solution Tb (hereinafter, simply referred to as Tb in some cases) is a collective term for solutions T1, T2, . . . , and Te (e is an integer 1 or more). As the solution Tb, only one solution (only T1) may be used or two or more solutions (T1, T2, . . . , and Te) may be used. The upper limit value of e is not particularly limited, but it is substantially preferably 4 or less and more preferably 3 or less since the operation is complicated when the solutions Tb are many.

In other words, e is preferably an integer 1 or more and 4 or less and more preferably an integer 1 or more and 3 or less.

The composition (second composition, unit: mol %) of the monomer in the solution Tb is the same as the target composition (unit: mol %) representing the content ratio (copolymerization composition, unit:mol %) of the constitutional units α'1 to α'n in the copolymer to be obtained.

In the case of using two or more solutions as the solution Tb, the "second composition of the solution Tb" means the composition of the monomer in each of T1 to Te. In other words, any of the composition of each monomer in T1 to Te is the same as the target composition.

For example, when the copolymer is a copolymer of a ternary compound system obtained by copolymerizing monomers x, y, and z and the target composition is x':y':z', the second composition x:y:z is the same as x':y':z'.

Incidentally, in an embodiment of the invention, the second composition (mol %) is a composition that is the same or nearly the same as the target composition (mol %) in order to obtain a desired effect. The second composition (mol %) is even more preferably the same as the target composition (mol %), but it is acceptable that the second composition has an error within a range of ±10% and preferably ±5% with respect to the target composition. In other words, it is regarded that the second composition is the same or nearly the same as the target composition when the second composition has an error in the above range.

The solution Tb is supplied to the reactor by dropwise addition.

[Solution Sa]

The solution Sa (hereinafter, simply referred to as Sa in some cases) is a collective term for the solutions S1, S2, . . . , and Sd (d is an integer 1 or more). As the solution Sa, only one solution (only S1) may be used or two or more solutions (S1, S2, . . . , and Sd) may be used. The upper limit value of d is not particularly limited, but it is substantially preferably 5 or less and more preferably 4 or less since the operation is complicated when the solutions Sa are many.

In other words, d is preferably an integer 1 or more and 5 or less and more preferably an integer 1 or more and 4 or less.

In the case of using two or more solutions as the solution Sa, the content ratio (first composition, unit:mol %) of the monomers in the solution Sa means the composition of the monomers in the sum from S1 to Sd.

The composition of the monomer in each of the solutions S1 to Sd may be the same as or different from one another, and the composition is different from the target composition in either case. The first composition is a composition in which the ratio of the monomer containing an acid leaving group among the monomers α1 to an is greater than the target composition. The content ratio (first composition) of the monomers in the solution Sa is preferably a composition that is designed in advance by taking the target composition in the copolymer and the reactivity of each monomer used in the polymerization into consideration. The method for designing the first composition will be described later.

The solution Sa may be charged in the reactor in advance or gradually supplied to the reactor by dropwise addition or the like, or these may be combined.

[Supply of Polymerization Initiator]

The polymerization initiator is supplied to the reactor by dropwise addition. The polymerization initiator may be contained in the solution Tb. The polymerization initiator may be contained in the solution Sa in the case of adding the solution Sa dropwise. The polymerization initiator may be contained in two or more solutions to be added dropwise (at least one solution selected from the group consisting of Sa and Tb). A solution (namely, a polymerization initiator solution) containing the polymerization initiator may be added dropwise separately from the solution Sa and the solution Tb. In addition, these may be combined.

The amount of the polymerization initiator used is set depending on the kind of the polymerization initiator and the target value of the weight average molecular weight of the copolymer to be obtained. For example, the amount of the polymerization initiator used is preferably in a range of from 1 to 25 mol % and more preferably in a range of from 1.5 to 20 mol % in a case in which the total amount of monomers supplied to the reactor is set to 100 mol %.

[Content of Monomer in Solution Sa]

The total amount (namely, the total monomer amount supplied) of the monomers used in the polymerization step is the sum of the monomers contained in the solution Sa and the solution Tb, and it is set depending on the amount of the copolymer to be obtained.

In addition, it is not possible to sufficiently obtain the desired effect due to the use of the solution Sa when the ratio of the total amount of the monomers contained in the solution Sa is too small in the total monomer amount supplied, and the molecular weight of the copolymer produced in the initial stage of the polymerization step is too high when the ratio is too great. Hence, the total amount of the monomers contained in the solution Sa is preferably from 3 to 40 mass % and more preferably from 5 to 30 mass % with respect to the total monomer amount supplied.

[Supply of Solution Sa and Solution Tb]

In the polymerization step, the solution Sa is required to be present in the reactor when the polymerization initiator is added to the reactor dropwise. Hence, the solution Sa is started to be supplied to the reactor before the polymerization initiator is added to the reactor dropwise or at the same time as the start of dropwise addition of the polymerization initiator.

In addition, it is required that the solution Sa is present in the reactor when the solution Tb is added to the reactor dropwise. Hence, the solution Tb is started to be supplied to the reactor after the solution Sa is started to be supplied to the reactor or at the same time as the start of supply of the solution Sa. It is preferable that the supply of the solution Tb is started at the same time as or after the start of supply of the polymerization initiator.

It is preferable that the dropwise addition of the polymerization initiator and the dropwise addition of the solution Tb are started at the same time. The supply of the solution Sa is completed before the dropwise addition of the solution Tb is completed.

The dropwise addition of the solution Tb may be continuous or intermittent, and the dropwise addition speed may be changed. It is preferable to continuously add the solution Tb dropwise at a constant speed in order to further stabilize the composition and molecular weight of the copolymer to be produced.

In the case of supplying the solution Sa by dropwise addition, the dropwise addition of the solution Sa may be continuous or intermittent, and the dropwise addition speed may be changed. It is preferable to continuously add the solution Sa dropwise at a constant speed in order to further stabilize the composition and molecular weight of the copolymer to be produced.

It is preferable to supply the entire amount of the solution Sa in the initial stage of the polymerization step. Specifically, it is preferable to complete the supply of the solution Sa before 20% of the reference time elapses where the reference time denotes the time from the start of dropwise addition of the polymerization initiator to the completion of dropwise addition of the solution Tb. For example, it is preferable to supply the entire amount of the solution Sa to the reactor before 48 minutes elapses from the start of dropwise addition of the polymerization initiator in a case in which the reference time is 4 hours.

The supply of the solution Sa is preferably completed before 15% of the reference time elapses and more preferably before 10% of the reference time elapses.

In addition, the entire amount of the solution Sa may be supplied at the time point at which the reference time is 0%. In other words, the entire amount of the solution Sa may be charged in the reactor before the start of dropwise addition of the polymerization initiator.

In other words, an aspect of the method for manufacturing a copolymer that is an embodiment of the invention is a manufacturing method which includes a step of supplying a monomer and a polymerization initiator to a reactor by dropwise addition and a polymerization step of obtaining a copolymer by polymerization of the monomer and is carried out by a dropping polymerization method in which the step of supplying a monomer and a polymerization initiator and the polymerization step proceed in the reactor at the same time.

In addition, the step of supplying a monomer and a polymerization initiator may include that the monomer is supplied as the solution Sa having the first composition and the solution Tb having the second composition, and in a case in which the monomer is supplied to the reactor as the solution Sa and the solution Tb, it is preferable to include that the solution Sa is supplied before the polymerization initiator is added to the reactor dropwise or at the same time as the start of dropwise addition of the polymerization initiator, to include that the solution Tb is supplied after the supply of the solution Sa to the reactor is started or at the same time as the start of supply of the solution Sa, and to include that the supply of the solution Sa is completed before the dropwise addition of the solution Tb is completed.

Furthermore, in a case in which the monomer is supplied to the reactor as the solution Sa and the solution Tb, it is preferable that the dropwise addition of the polymerization initiator and the dropwise addition of the solution Tb are started at the same time and it is preferable that the dropwise addition of the polymerization initiator is conducted until the dropwise addition of the solution Tb is completed.

[Supply Speed of Polymerization Initiator]

The dropwise addition of the polymerization initiator may be conducted until the dropwise addition of the solution Tb is completed, or it may be completed before it. It is preferably conducted until the dropwise addition of the solution Tb is completed.

It is preferable that the molecular weight of the copolymer to be produced at each moment gently decreases from the initial stage to the later stage of the polymerization. The molecular weight of the copolymer to be produced gently decreases from the initial stage to the later stage of the polymerization when the initiator is supplied such that the proportion of the molar concentration of the radical generated from the initiator in the reactor with respect to the molar concentration of the monomer in the reactor gently increases from the initial stage to the later stage of the polymerization.

For example, in a case in which the reference time from the start of dropwise addition of the polymerization initiator to the completion of dropwise addition of the solution Tb is 4 hours, the weight average molecular weight of the copolymer to be produced within 30 minutes after the start of dropwise addition of the polymerization initiator is preferably from 101 to 200%, more preferably from 102 to 150%, and even more preferably from 103 to 130% when the weight average molecular weight of the copolymer to be produced during the entire polymerization step is set to 100%.

[Preferred Aspect of Polymerization Step]

As a preferred aspect of the polymerization step, the following (A), (B), and (C) may be mentioned.

(A) The entire amount (S1) of a solution Sa containing monomers $\alpha1$ to $\alpha n$ at the first composition is charged in a reactor in advance, the inside of the reactor is heated to a predetermined polymerization temperature (for example, 80° C.), and a solution Tb containing monomers $\alpha1$ to $\alpha n$ at the second composition and a polymerization initiator is then added to the reactor dropwise. A polymerization initiator solution containing a portion of the polymerization initiator may be added dropwise together with the solution Tb. The polymerization initiator solution and the solution Tb are started to be added dropwise at the same time, or the polymerization initiator solution is first started to be added dropwise. It is preferable to add them dropwise at the same time. The time from the start of dropwise addition of the polymerization initiator solution to the start of dropwise addition of the solution Tb is preferably from 0 to 10 minutes.

It is preferable that the dropwise addition speed of each of them is constant. The dropwise addition of the polymerization initiator solution is completed earlier than that of the solution Tb.

(B) Only a solvent is charged in a reactor and heated to a predetermined polymerization temperature (for example, 80° C.), and a solution Sa containing monomers $\alpha1$ to $\alpha n$ at the first composition and a solution Tb containing monomers $\alpha1$ to $\alpha n$ at the second composition and a polymerization initiator are then added thereto dropwise, respectively. The solution Sa may contain a portion of the polymerization initiator. The two solutions are started to be added dropwise at the same time, or the solution Sa is first started to be added dropwise. The time from the start of dropwise addition of the solution Sa to the start of dropwise addition of the solution Tb is preferably from 0 to 10 minutes.

It is preferable that the dropwise addition speed of each of them is constant. The dropwise addition of the solution Sa is completed earlier than that of the solution Tb.

(C) A portion of a solution Sa is charged in a reactor in advance, the inside of the reactor is heated to a predetermined polymerization temperature (for example, 80° C.), and the remainder of the solution Sa and a solution Tb containing monomers α1 to αn at the second composition and a polymerization initiator are then added to the reactor dropwise, respectively. The remainder of the solution Sa may contain a portion of the polymerization initiator. The remainder of the solution Sa and the solution Tb are started to be added dropwise at the same time, or the remainder of the solution Sa is first started to be added dropwise. It is preferable that they are started to be added dropwise at the same time. The time from the start of dropwise addition of the remainder of the solution Sa to the start of dropwise addition of the solution Tb is preferably from 0 to 10 minutes.

It is preferable that the dropwise addition speed of each of them is constant. The dropwise addition of the remainder of the solution Sa is completed earlier than that of the solution Tb.

After the completion of dropwise addition of the solution Tb, it is possible to appropriately carry out a keeping step of keeping the inside of the reactor at the polymerization temperature, a cooling step, a purification step, and the like if necessary.

In other words, an aspect of the method for manufacturing a copolymer of an embodiment of the invention is a manufacturing method which includes supplying the entire amount (S1) of a solution Sa containing monomers α1 to αn at the first composition to a reactor, heating the inside of the reactor to a predetermined polymerization temperature, supplying monomers α1 to αn to the reactor at the second composition, and adding a solution Tb containing a polymerization initiator thereto dropwise.

The manufacturing method may include adding a polymerization initiator solution containing a portion of the polymerization initiator dropwise together with the solution Tb.

In the case of adding the polymerization initiator solution dropwise, the manufacturing method may include that the polymerization initiator solution and the solution Tb are started to be added dropwise at the same time or the polymerization initiator solution is first started to be added dropwise.

The time from the start of dropwise addition of the polymerization initiator solution to the start of dropwise addition of the solution Tb is preferably from 0 to 10 minutes.

The dropwise addition speed of each of them may be constant, or the manufacturing method may include that the dropwise addition of the polymerization initiator solution is completed earlier than that of the solution Tb.

Another aspect of the method for manufacturing a copolymer that is an embodiment of the invention is a manufacturing method which includes supplying only a solvent to a reactor, heating the solvent to a predetermined polymerization temperature, adding a solution Sa containing monomers α1 to αn at the first composition and a solution Tb containing monomers α1 to αn at the second composition and a polymerization initiator to the reactor dropwise, respectively, and completing the dropwise addition of the solution Sa earlier than that of the solution Tb.

Furthermore, in the manufacturing method, the solution Sa may contain a portion of the polymerization initiator, the manufacturing method may include that the two solutions of the solution Sa and the solution Tb are started to be added dropwise at the same time or the solution Sa is first started to be added dropwise, the time from the start of dropwise addition of the solution Sa to the start of dropwise addition of the solution Tb may be from 0 to 10 minutes, and the dropwise addition speed of the two solutions may be constant, respectively.

Still another aspect of the method for manufacturing a copolymer that is an embodiment of the invention is a manufacturing method which includes supplying a portion of a solution Sa to a reactor in advance, heating the inside of the reactor to a predetermined polymerization temperature, adding the remainder of the solution Sa and a solution Tb containing monomers α1 to αn at the second composition and a polymerization initiator to the reactor dropwise, respectively, and completing dropwise addition of the remainder of the solution Sa earlier than that of the solution Tb.

In the manufacturing method, the remainder of the solution Sa may contain a portion of the polymerization initiator, the manufacturing method may include that the remainder of the solution Sa and the solution Tb are started to be added dropwise at the same time or the remainder of the solution Sa is first started to be added dropwise, the time from the start of dropwise addition of the remainder of the solution Sa to the start of dropwise addition of the solution Tb may be from 0 to 10 minutes, and the dropwise addition speed of each of them may be constant.

<Method for Designing First Composition of Solution Sa (First Method)>

Hereinafter, an aspect of the preferred method for designing the first composition (namely, the first method) will be described.

In the present method, the composition (namely, the first composition) of the monomers in the sum of the solutions S1 to Sd is designed such that the ratio of the monomer which contains an acid leaving group is higher than that in the composition (U) of the unreacted monomers that is determined by the following methods (a) and (b) and the ratio of the monomer which does not an acid leaving group is lower than that in the composition (U).

(a): First, a dropping solution containing a monomer mixture in which the monomer composition is the same or nearly the same as the target composition α'1: α'2: . . . : α'n, a polymerization initiator, and a solvent is added to a reactor which contains only a separate solvent and is adjusted to the polymerization temperature dropwise at a constant dropwise addition speed and the time course of the composition of the unreacted monomers present in the reactor is measured.

(b): The composition (U) of the unreacted monomers when the composition of the unreacted monomers measured in (a) above is in a constant or nearly constant state is determined. Incidentally, the term "nearly the same" means a composition to be target composition±5 mol %.

In (a), when the relation between the time period and the composition of the unreacted monomers in the reaction mixture is examined, the composition of the unreacted monomers fluctuates in the initial stage of the reaction, the composition of the unreacted monomers is then almost stabilized (namely, constant or nearly constant state) in the middle stage of the reaction, and the composition of unreacted monomers fluctuates again in the final stage of the reaction after the supply of the dropping solution is completed.

In (b), the composition of the unreacted monomers when being in the stable state in the middle stage of the reaction is measured. Incidentally, the term "stable state (constant or nearly constant state) of the composition of the unreacted monomer" refers to a state in which the measured value of each of the content ratios (mol %) of the respective monomers is from 90 to 110%, preferably from 95 to 105%, and more preferably 96 to 104% when the value measured immediately before this measurement is set to 100%.

For example, it is preferable that the average value of the composition of the unreacted monomers at a time tm (m is an integer 1 or more and 20 or less) and the composition of the unreacted monomers at a time tm+1 is adopted as the composition (U) of the unreacted monomers determined in (b) when the fluctuation range between the measured value at the time tm and the measured value at the time tm+1 is smallest where the time elapsed from the start of dropwise addition is denoted as t1, t2, t3, . . . .

Incidentally, the set time as the time elapsed from the start of dropwise addition is from 30 to 90 minutes, and the time interval between the measurements within the set time is the same.

When the content ratio of the unreacted monomers present in the reactor is the composition (U), the content ratio of the constitutional unit of the copolymer molecule produced immediately after the dropwise addition becomes almost the same as the target composition when a solution having the target composition is added to the reactor dropwise, and thus the composition (U) of the unreacted monomers determined in (b) is a composition in which the composition of the unreacted monomers remaining in the reactor becomes constant. A steady state is obtained in which a copolymer molecule having a composition close to the target composition is continuously produced all the time when the solution Tb is continuously added to the reactor in such a state dropwise.

In the present method, the first composition is designed such that the ratio of the monomer which contains an acid leaving group is higher (for example, higher by from 5 to 15 mol %) than that in the composition (U) of the unreacted monomers that is determined in (b) above and the ratio of the monomer which does not an acid leaving group is lower (for example, lower by from 5 to 15 mol %) than the composition (U).

By virtue of this, it is possible to obtain the intended copolymer since a copolymer molecule which has a high molecular weight and contains more acid leaving groups is produced in the initial stage of the polymerization and the steady state is then obtained.

From the viewpoint of easily obtaining the copolymer of an embodiment of the invention, the content ratio (mol %) of the monomer containing an acid leaving group in the first composition is preferably within a range of from 1.1 to 1.9 times, more preferably from 1.2 to 1.9 times, and even more preferably from 1.3 to 1.8 times the value of the content ratio (mol %) of the monomer containing an acid leaving group in the composition (U).

The ratio of the content ratios of the monomers which do not contain an acid leaving group in the first composition is preferably almost the same as the ratio in the composition (U).

Incidentally, the term "almost the same" herein means that it is within ±5 mol %.

<Method for Designing First Composition of Solution Sa (Second Method)>

Hereinafter, another aspect of the preferred method for designing the first composition (namely, the second method) will be described.

In the present method, the content ratio of each constitutional unit of the composition (namely, the first composition) of the monomers in the sum of the solutions S1 to Sd is respectively designed in a range of from 0.75 to 1.25 times, preferably in a range from 0.8 to 1.2 times, and more preferably in a range of from 0.9 to 1.1 times the value for the content ratio of each constitutional unit in the composition of S'a determined by the following methods (1A) to (4A).

(1A) First, a dropping solution containing 100 parts by mass of a monomer mixture in which the monomer composition is the same as the target composition α'1: α'2: α'n, a polymerization initiator, and a solvent is added to a reactor which contains only a separate solvent and is adjusted to the polymerization temperature dropwise at a constant dropwise addition speed, and the composition (unit: mol %) M1: M2: . . . : Mn of the respective monomers α1 to αn remaining in the reactor and the ratio (unit:mol %) P1: P2: . . . : Pn of the constitutional units α1 to α'n in the copolymers which are respectively produced during a period from t1 to t2, a period from t2 to t3, . . . where t1, t2, t3, . . . denotes the time elapsed from the start of dropwise addition are determined.

Incidentally, the set time as the time elapsed from the start of dropwise addition is from 30 to 90 minutes, and the time intervals between measurements within the set time are the same as one another.

(2A) The time period "period from tm to tm+1 (m is an integer 1 or more and 20 or less)" in which P1: P2: . . . : Pn is most close to the target composition α'1: α'2: . . . : α'n is found.

(3A) The factors F1, F2, . . . , and Fn are determined by the following Equation from the values of P1: P2: . . . : Pn in the "period from tm to tm+1" and the values of M1: M2: . . . : Mn at an elapsed time tin.

$$F1=P1/M1, F2=P2/M2, \ldots, \text{ and } Fn=Pn/Mn$$

(4A) The composition (mol %) of S'a is determined by the following Equation from G1, G2, . . . , and Gn which are the functions of the factors F1, F2, . . . , and Fn determined in (3A) above and the target composition α'1: α'2: . . . : α'n where the composition (mol %) of S'a is represented by α11: α12: . . . : α1n.

$$Gi=Fi$$

However, it is $Gi=Fi/3$ when α1$i$ is a content ratio of the monomer containing an acid leaving group. (i is a natural number 1 or more and n or less. n is the same as the above.)

$$a11=(\alpha 1/G1)/(\alpha 1/G1+\alpha 2/G2+ \ldots +\alpha' n/Gn) \times 100,$$

$$a12=(\alpha' 2/G2)/(\alpha' 1/G1+\alpha' 2/G2+ \ldots +\alpha' n/Gn) \times 100, \ldots, \text{ and } \alpha 1n=(\alpha' n/Gn)/(\alpha' 1/G1+\alpha' 2/G2+ \ldots +\alpha' n/Gn) \times 100.$$

[Method for determining factors Fx, Fy, and Fz] Hereinafter, the second method will be described by taking a case in which the copolymer is a copolymer of a ternary compound system as an example, but it is possible to determine the factors in the same manner even in a binary compound system or a quaternary or higher compound system.

(1B) First, a dropping solution containing a monomer mixture in which the monomer composition is the same as the target composition x': y': z', a solvent, and a polymerization initiator is added to a reactor adjusted to the polymerization temperature dropwise at a constant dropwise addition speed v. Only the solvent is charged in the reactor in advance.

The composition (unit: mol %) Mx: My: Mz of the respective monomers x, y, and z remaining in the reactor and the ratio (unit:mol %) Px:Py:Pz of the constitutional units in the copolymer which are respectively produced during a period from t1 to t2, a period from t2 to t3, . . . where t1, t2, t3, . . . denotes the time elapsed from the start of dropwise addition are determined.

(2B) The time period "from tm to tm+1 (m is an integer 1 or more and 20 or less)" in which Px:Py:Pz is most close to the target composition x':y':z' is found.

(3B) The factors Fx, Fy, and Fz are determined by the following Equation from the values of Px:Py:Pz in the "period from tm to tm+1" and the values of Mx:My:Mz at an elapsed time tm.

$$Fx=Px/Mx, Fy=Py/My, Fz=Pz/Mz.$$

The factors Fx, Fy, and Fz are a value reflecting the relative reactivity of the respective monomers and changes as the combination of the monomers used in the polymerization or the target composition.

(4B) The composition (mol %) x00: y00: z00 of S'a is designed using Gx, Gy, and Gz which are the functions of the factors Fx, Fy, and Fz. It is calculated from x00=x'/Gx, y00=y'/Gy, and z00=z'/Gz by setting Gx=Fx/3, Gy=Fy, and Gz=Fz in a case in which x00 is the content ratio of the monomer which contains an acid leaving group and y00 and z00 are the content ratios of the monomers which do not contain an acid leaving group.

The factors Fx, Fy, and Fz determined in (3B) are a composition in which the composition of the unreacted monomers remaining in the reactor becomes almost constant as the content ratio of the constitutional unit of the copolymer molecule produced immediately after the dropwise addition becomes almost the same as the target composition when a solution having the target composition is added to the reactor dropwise, for example, when the content ratio of the monomers present in the reactor is x00=x'/Fx, y00=y'/Fy, and z00=z'/Fz. Hence, a steady state is obtained in which a copolymer molecule having a composition close to the target composition is continuously produced all the time when the solution having the target composition is continuously added to the reactor dropwise.

In the present method, the first composition is designed using Gx, Gy, and Gz which are the functions of the factors Fx, Fy, and Fz in (4B). At this time, a value obtained by dividing the value of F by 3 is adopted as G (Gx=Fx/3) for the monomer containing an acid leaving group (for example, x) and it is G=F(Gy=Fy, Gz=Fz) for the monomers which do not contain an acid leaving group.

In this manner, as the first composition is designed using a value obtained by dividing the value of the factor F by 3 for only the monomer containing an acid leaving group, a copolymer molecule which has a higher molecular weight and contains properly many acid leaving groups is produced in the initial stage of the polymerization and then the steady state described above is obtained.

According to the knowledge of the present inventors and the like, it is even more preferable that the divisor of the factor F of the monomer containing an acid leaving group is 3.

In other words, the factor F of a monomer containing an acid leaving group is an indicator representing the height of the copolymerization reactivity of the monomer, and a copolymer having a copolymerization composition ratio the same as that in a steady state is obtained when the factor F is used as it is (namely, when the factor F is divided by 1). It is required to increase the divisor in order to increase the molecular weight and to contain more acid leaving groups in the initial stage of polymerization, and the divisor is even more preferably 3.

In other words, an aspect of the method for designing the first composition of the solution Sa includes determining the monomer composition of the composition (U) of the unreacted monomers by the methods (a) and (b) and designing the composition of the monomers in the sum of the solutions S1 to Sd such that the ratio of the monomer which contains an acid leaving group is higher than that in the composition (U) of the unreacted monomers determined above and the ratio of the monomer which does not contain an acid leaving group is lower than that in the composition (U) as the first composition.

In addition, another aspect of the method for designing the first composition of the solution Sa includes determining the values of the content ratios of the respective constitutional units in the composition of S'a by the methods (1A) to (4A); and designing the content ratios of the respective constitutional units in the composition of the monomers in the sum of the solutions S1 to Sd to be within a range of from 0.75 to 1.25 times the values of the content ratios of the respective constitutional units in the composition of S'a, respectively, as the first composition.

The first method is simple since a state in which the composition of the unreacted monomers in the reactor becomes almost constant is regarded as a steady state to design the first composition.

In the second method, a state close to the true steady state is likely to be obtained in the manufacture of a copolymer since a state in which the copolymer composition of the copolymer produced in the reactor is closest to the target composition is found and further the first composition is designed using a factor F that reflects the reaction rate ratio in that state.

In the relation between the first composition designed by the second method and the composition (U) of the unreacted monomers determined by the methods (a) and (b) in the first method, the content ratio (mol %) of the monomer containing an acid leaving group in the first composition is within a range of from 1.1 to 1.9 times, preferably within a range of from 1.2 to 1.9 times, and preferably within a range from 1.3 to 1.8 times the value of the content ratio (mol %) of the monomer containing an acid leaving group in the composition (U).

There may be a case in which the first composition designed by the first method and the first composition designed by the second method are identical to each other.

<Resist Composition>

The resist composition of an embodiment of the invention is prepared by dissolving the copolymer for lithography of an embodiment of the invention in a resist solvent. Examples of the resist solvent may include the same solvent as the polymerization solvent in the manufacture of the copolymer.

A compound (hereinafter, referred to as the photoacid generator) which generates an acid by irradiation of an actinic ray or radiation (for example, X-rays and electron beams) is contained in the resist composition in a case in which the resist composition of an embodiment of the invention is a chemically amplified resist composition.

(Photoacid Generator)

The photoacid generator can be arbitrarily selected from known photoacid generators in the chemically amplified resist composition. The photoacid generator may be used singly, or two or more kinds thereof may be used concurrently.

Examples of the photoacid generator may include an onium salt compound, a sulfonimide compound, a sulfone compound, a sulfonate compound, a quinonediazide compound, and a diazomethane compound.

The content of the photoacid generator in the resist composition is preferably from 0.1 to 20 parts by mass and more preferably from 0.5 to 10 parts by mass with respect to 100 parts by mass of the copolymer for lithography.

(Nitrogen-Containing Compound)

The chemically amplified resist composition may contain a nitrogen-containing compound. The resist pattern shape and the post exposure temporal stability are further improved by containing a nitrogen-containing compound. In other words, the cross-sectional shape of the resist pattern becomes closer to a rectangle by containing a nitrogen-containing compound. In addition, in the mass production line of the semiconductor device, the resist film is irradiated with light, subsequently baked (PEB), and then left to stand for several hours until it is subjected to the subsequent developing treatment in some cases, but the occurrence of the degradation of the cross-sectional shape of the resist pattern due to such standing (aging) is further suppressed.

As the nitrogen-containing compound, an amine is preferable and a secondary lower aliphatic amine and a tertiary lower aliphatic amine are more preferable.

The content of the nitrogen-containing compound in the resist composition is preferably from 0.01 to 2 parts by mass with respect to 100 parts by mass of the copolymer.

(Organic Carboxylic Acid and Oxo Acid of Phosphorus or Derivative Thereof)

The chemically amplified resist composition may contain an organic carboxylic acid and an oxo acid of phosphorus or a derivative thereof (hereinafter, these are collectively referred to as the acid compound). By containing the acid compound, it is possible to suppress the degradation in sensitivity due to the blending of a nitrogen-containing compound and the resist pattern shape and post exposure temporal stability are further improved.

Examples of the organic carboxylic acid may include malonic acid, citric acid, malic acid, succinic acid, benzoic acid, and salicylic acid.

Examples of oxo acid of phosphoric or a derivative thereof may include phosphorous acid or a derivative thereof, phosphonic acid or a derivative thereof, and phosphinic acid or a derivative thereof.

The content of the acid compound in the resist composition is preferably from 0.01 to 5 parts by mass with respect to 100 parts by mass of the copolymer.

(Additive)

The resist composition of an embodiment of the invention may contain various kinds of additives such as a surface active agent, another quencher, a sensitizer, an antihalation agent, a storage stabilizer, and a defoaming agent if necessary. It is possible to use any one as long as it is a known additive in the art as the additives. In addition, the amount of these additives is not particularly limited and may be appropriately determined.

<Method for Manufacturing Substrate having Pattern Formed Thereon>

An example of the method for manufacturing a substrate on which a pattern is formed of an embodiment of the invention will be described.

First, the resist composition of an embodiment of the invention is coated on the surface to be processed of a substrate such as a silicon wafer to be subjected to the formation of a desired fine pattern by spin coating or the like. Thereafter, the substrate coated with the resist composition is dried by a baking treatment (pre-bake) or the like to form a resist film on the substrate.

Subsequently, the resist film is exposed via a photomask to form a latent image. The exposure light is preferably light having a wavelength of 250 nm or less. For example, KrF excimer laser, ArF excimer laser, F2 excimer laser, and EUV light are preferable, and ArF excimer laser is even more preferable. In addition, the resist film may be irradiated with an electron beam.

In addition, liquid immersion exposure to irradiate the resist film with light in a state in which a liquid having a high refractive index, such as pure water, perfluoro-2-butyltetrahydrofuran, or perfluoro-trialkylamine, is interposed between the resist film and the final lens of the exposure apparatus may be conducted.

[Development]

After the exposure, a portion of the thin film on the substrate is dissolved by conducting the developing treatment. After the development, the substrate is appropriately subjected to the cleaning treatment (rinsing treatment) with pure water or the like. In this manner, a resist pattern is formed on the substrate to be processed.

The developing method may be either of a positive type or a negative type. In the case of a positive type, the thin film in the exposed region is dissolved. In the case of a negative type, the thin film in the unexposed region is dissolved. After the development, a cleaning treatment with a cleaning solution is conducted.

Although the developing method is not particularly limited, it is possible to apply, for example, a method (dipping method) in which the substrate is immersed in a bath filled with a developing solution for a certain time, a method (paddle method) in which the development is conducted by heaping a developing solution on the substrate surface using surface tension and leaving it to stand still for a certain time, a method (spray method) in which a developing solution is sprayed on the substrate surface, a method (dynamic dispense method) in which a developing solution is continuously ejected and coated on the substrate rotating are at a constant speed while scanning the nozzle ejecting and coating the developing solution at a constant speed.

In other words, an aspect of the method for manufacturing a substrate on which a pattern is formed of an embodiment of the invention is a manufacturing method which includes coating the resist composition of an embodiment of the invention on the surface to be processed of a substrate; drying the substrate coated with the resist composition to form a resist film on the substrate; exposing the resist film via a photomask to form a latent image; and developing the resist film using a developing solution after the exposure.

It is preferable to conduct the exposure using light having a wavelength of 250 nm or less.

[Developing Solution]

It is preferable to use an alkaline developing solution in the case of conducting positive type development. As the alkaline developing solution, an alkaline aqueous solution is preferably used. It is possible to use, for example, an aqueous solution of an inorganic alkali such as sodium hydroxide, potassium hydroxide, sodium carbonate, sodium silicate, sodium meta-silicate, or ammonia water; a primary amine such as ethylamine or n-propylamine; a secondary amine such as diethylamine or di-n-butylamine; a tertiary amine such as triethylamine or methyldiethylamine; an alcohol amine such as dimethylethanolamine or triethanolamine; a quaternary ammonium salt such as tetramethylammonium hydroxide or tetraethylammonium hydroxide; and a cyclic amine such as pyrrole or piperidine; and the like.

As the cleaning solution in the cleaning treatment conducted after the positive type development, pure water is used, and the cleaning solution can also be used by adding an appropriate amount of a surface active agent.

It is preferable to use a developing solution containing an organic solvent (hereinafter, also referred to as the organic developing solution) in the case of conducting negative type development. As the organic developing solution to be used when conducting negative type development, it is possible to use, for example, a ketone-based solvent such as acetone or methyl ethyl ketone; an ester-based solvent such as methyl acetate, butyl acetate, ethyl acetate, or propylene glycol monomethyl ether acetate; an alcohol-based solvent such as methyl alcohol, ethyl alcohol, isopropyl alcohol, or 1-methoxy-2-propanol; a hydrocarbon-based solvent such as toluene, xylene, pentane, hexane, or heptane; and the like.

It is possible to enhance the resist and to selectively etch the part where the resist is not present by appropriately subjecting the substrate on which a resist pattern is formed to a heat treatment (post-bake).

A substrate on which a fine pattern is formed is obtained by removing the resist using a release agent after the etching The copolymer for lithography obtained by the manufacturing method of the invention exhibits excellent solubility in a solvent and can form a resist film exhibiting uniform solubility in a developing solution and high sensitivity when being used in a resist composition.

Hence, it is possible to easily and favorably dissolve the copolymer in a resist solvent when preparing a resist composition.

In addition, in the case of a positive type resist composition, it exhibits excellent solubility in an alkaline developing solution and contributes to the improvement in sensitivity. In addition, a defect due to the insoluble matter is less likely to generate in the pattern formation since the resist composition contains a smaller amount of insoluble matter.

In the case of a negative type resist composition, it exhibits excellent solubility in an organic solvent that is a negative type developing solution and contributes to the improvement in sensitivity. In addition, a defect due to the insoluble matter is less likely to generate in the pattern formation since the resist composition contains a smaller amount of insoluble matter.

Hence, according to the method for manufacturing a substrate of an embodiment of the invention, it is possible to stably form a highly precise fine resist pattern having fewer defects on a substrate by using the resist composition of the invention. In addition, the resist composition can also be suitably used in the pattern formation by photolithography using exposure light having a wavelength of 250 nm or less or electron beam lithography, for example, lithography using ArF excimer laser (193 nm) which requires the use of a resist composition exhibiting high sensitivity and high resolution.

Incidentally, it is preferable to appropriately select and use the monomer so that the copolymer is transparent at the wavelength of exposure light in the case of manufacturing a resist composition to be used in photolithography using exposure light having a wavelength of 250 nm or less.

<Evaluation by Turbidity>

The copolymer for lithography of an embodiment of the invention is a copolymer for lithography in which the turbidity $Th(80)$ of a PGMEA solution is 1.0 NTU or more and 4.6 NTU or less when n-heptane in an amount to be 80% of $(X)h$ is added to the PGMEA solution where $(X)h$ denotes the amount of n-heptane added to have a turbidity of 10 NTU when n-heptane is added to the PGMEA solution containing the copolymer for lithography at 20 wt % with respect to the total mass of the PGMEA solution.

$Th(80)$ is preferably 1.0 NTU or more and 4.5 NTU or less, more preferably 1.3 NTU or more and 4.4 NTU or less, even more preferably 1.6 NTU or more and 4.3 NTU or less, and even more preferably 2.0 NTU or more and 4.2 NTU or less from the viewpoint of high solubility in PGMEA solvent and of being able to be suitably used as a material for lithography.

The solution obtained by adding n-heptane in a PGMEA solution in which the content of the copolymer for lithography is 20 wt % with respect to the total mass of the PGMEA solution is adjusted to 25° and stirred for 4 hours, and then the turbidity thereof is measured.

It is possible to use, for example, the TB200 manufactured by Orbeco-Hellige, Inc for the measurement of turbidity, and the turbidity can be measured by adjusting the solution temperature to 25° C.

In addition, The copolymer for lithography of an embodiment of the invention is a copolymer for lithography in which the turbidity $Tm(80)$ of a PGMEA solution is 1.0 NTU or more and 3.8 NTU or less when methanol in an amount to be 80% of $(X)m$ is added to the PGMEA solution where $(X)m$ denotes the amount of methanol added to have a turbidity of 5.0 NTU when methanol is added to the PGMEA solution containing the copolymer for lithography at 20 wt % with respect to the total mass of the PGMEA solution.

$Tm(80)$ is preferably 1.2 NTU or more and 3.7 NTU or less, more preferably 1.4 NTU or more and 3.6 NTU or less, even more preferably 1.6 NTU or more and 3.5 NTU or less, and even more preferably 1.8 NTU or more and 3.4 NTU or less from the viewpoint of high solubility in PGMEA solvent and of being able to be suitably used as a material for lithography.

The turbidity $Th(80)$ and the turbidity $Tm(80)$ are higher than the turbidity of the PGMEA solution in which the content of the copolymer for lithography is 20 wt % with respect to the total mass of the PGMEA solution and to which n-heptane and methanol are not yet added, respectively.

The copolymer of an embodiment of the invention exhibits excellent dissolution stability in a solvent as an increase in turbidity is gentle in both of the case of adding n-heptane which exhibits lower polarity than PGMEA to a 20 wt % PGMEA solution (namely, the PGMEA solution in which the content of the copolymer for lithography is 20 wt % with respect to the total mass of the PGMEA solution) and the case of adding methanol exhibits higher polarity than PGMEA thereto.

The method for manufacturing a copolymer satisfying that the turbidity $Th(80)$ is 4.6 NTU or less and the turbidity (80) is 3.8 NTU or less is not particularly limited, but examples thereof may include a manufacturing method in which the polymerization reaction described above is used, a method in which a copolymer having the desired copolymer composition and molecular weight is removed by cleaning or separation operation, and a method in which copolymers having different copolymer composition distributions and molecular weight distributions are mixed together. The manufacturing method by the polymerization reaction described above is preferable from the viewpoint of obtaining the copolymer at a favorable productivity by one time of polymerization reaction.

<Method for Evaluating Low Temperature Solubility>

The low temperature solubility of the copolymer of an embodiment of the invention can be evaluated by the following method. Specifically, the method is an evaluating method in which the temperature of a test solution which is composed of a copolymer for lithography, a good solvent for the copolymer, and a poor solvent for the copolymer and from which the copolymer is not precipitated is lowered to measure the temperature at which the copolymer is precipitated, and it includes (A) a test solution adjusting step of adjusting the test solution and (B) an evaluating step of measuring the precipitation temperature by lowering the temperature of the test solution.

<(A) Test Solution Preparing Step>

The test solution contains a copolymer for lithography, a good solvent for the copolymer, and a poor solvent for the copolymer.

As the preparation procedure, the copolymer may be completely dissolved in a good solvent and a poor solvent may be then added thereto, the copolymer may be dissolved in a mixed solvent of a good solvent and a poor solvent, or further the copolymer, a good solvent, and a poor solvent may be mixed at the same time. Among these, a method in which the copolymer is completely dissolved in a good solvent and a poor solvent is then added thereto is even more preferable from the viewpoint that precipitation of the copolymer hardly occurs and the solution is less likely to be non-uniform.

The kind of the good solvent and the ratio of the copolymer for lithography to the good solvent are not particularly limited as long as the copolymer and the good solvent are uniformly mixed so as to be in a state in which the copolymer is not precipitated.

As the ratio of the copolymer to the good solvent, the copolymer is preferably from 0.5 to 30 mass % and even more preferably from 5 to 25 mass % with respect to 100 mass % of the good solvent. In the present evaluating method, the precipitation temperature of the copolymer is measured by decreasing the solubility of the copolymer in the good solvent by the coexistence of the poor solvent and further lowering the temperature, and thus the copolymer is completely dissolved in the good solvent when the concentration of the copolymer is from 0.5 to 30 mass % with respect to 100 mass % of the good solvent, and also the copolymer is likely to precipitate at a low temperature by the coexistence of the poor solvent.

The "good solvent" in the present specification refers to a solvent which can completely dissolve the copolymer for lithography in a solvent amount to be 5 times or less the mass of the copolymer for lithography at room temperature (for example, 25° C.). Particularly, it is preferable to use a solvent capable of completely dissolving the copolymer for lithography in a solvent amount to be 3 times or less the mass of the copolymer for lithography. The good solvent used in the test solution may be a single solvent or a mixture of two or more kinds of solvents. In the case of a mixed solvent, those which satisfy the above conditions for a good solvent after mixing can be used as the good solvent.

The term "can completely dissolve" means a state in which a solution is in a visually transparent state.

Meanwhile, the "poor solvent" refers to a solvent which does not dissolve the copolymer for lithography at all even when a single solvent in an amount to be 5 times the mass of the copolymer for lithography is added to the copolymer for lithography and they are stirred at room temperature (for example, 25° C.). Particularly, it is preferable to use a solvent which does not dissolve the copolymer for lithography at all even when a single solvent in an amount to be 10 times the mass of the copolymer for lithography is added. In the case of a mixed solvent, those which satisfy the above conditions for a poor solvent after mixing can be used as the poor solvent. The term "not to dissolve at all" means a state in which the polymer can be visually detected as an insoluble substance.

The amount of the poor solvent is not particularly limited as long as it is in the range in which the precipitation of the copolymer for lithography does not occur, and also the optimum amount thereof varies depending on the molecular weight or composition of the copolymer for lithography but the standard is generally as follows. In other words, the amount of a poor solvent added in which the precipitation of polymer starts is examined by adding a poor solvent to a solution adjusted only by the copolymer for lithography and a good solvent, and it is preferable to adjust the test solution using a poor solvent in an amount to be from 95.0 to 99.5% of the amount of poor solvent added and it is more preferable to adjust the test solution using a poor solvent in an amount to be from 97.0 to 99.0% of the amount of poor solvent added.

In the present evaluating method, the solubility of the copolymer in a good solvent is decreased by the coexistence of the poor solvent. This causes the aggregation of poorly soluble components in the copolymer, and further the precipitation of the entire copolymer occurs as the temperature is lowered. In the present evaluating method, it is possible to evaluate the solubility of the copolymer at a low temperature by measuring this precipitation temperature.

In addition, the precipitation occurs at a temperature close to room temperature as a poor solvent is added in the amount described above, and thus it is possible to simply conduct the evaluation in a short time.

As the good solvent, it is possible to use those which are appropriately selected from known lithography solvents used when preparing a composition for lithography. The good solvent may be used singly or in combination of two or more kinds thereof.

Specific examples of the preferred good solvent may include tetrahydrofuran (THF), 1,4-dioxane, acetone, methyl ethyl ketone, methyl isobutyl ketone, propylene glycol monomethyl ether (PGME), propylene glycol monomethyl ether acetate (PGMEA), methyl lactate, ethyl lactate, butyl lactate, and γ-butyrolactone.

As the poor solvent, it is possible to use pentane, hexane, heptane, octane, cyclohexane, methylcyclohexane, benzene, toluene, xylene, diethyl ether, diisopropyl ether (IPE), methanol, ethanol, isopropanol, water, and the like. The poor solvent may be used singly or in combination of two or more kinds thereof.

Particularly, in a case in which the copolymer for resist of the evaluation target is an acrylic copolymer, it is preferable to use PGMEA (propylene glycol monomethyl ether acetate), ethyl lactate, THF (tetrahydrofuran), or PGME (propylene glycol monomethyl ether) as the good solvent and IPE (diisopropyl ether), hexane, heptane, methanol, or isopropanol as the poor solvent.

<(B) Evaluation Step>

The temperature of the test solution is lowered, and the temperature at which the copolymer precipitates is measured. The method for lowering the temperature is not particularly limited, but examples thereof may include a method to put the test solution in a thermostatic bath capable of finely controlling the temperature (the minimum set width is 0.1° C. or lower) to lower the temperature of the thermostatic bath, a method to lower the temperature of the room in which the test solution is put, and a method to put the test solution to which a thermometer is directly installed in a refrigerator.

It is desirable that the vessel to contain the test solution when lowering the temperature of the test solution is a hermetically sealed or substantially hermetically sealed vessel. The "hermetically sealed or substantially hermetically sealed vessel" is not particularly limited as long as volatilization of the solvent and condensation of the test solution can be suppressed, and a dedicated lid or a cover may be put on the vessel.

In addition, it is preferable to carry out the test while stirring the test solution so that the internal temperature thereof is uniform all the time.

It is preferable to stir the test solution for a certain time from the time point at which the poor solvent is added to the measurement. The stirring time is not particularly limited as long as the test solution becomes uniform, but it is preferably from 1 to 8 hours and more preferably from 2 to 6 hours. The solubility of the copolymer in a good solvent decreases by the addition of a poor solvent so that the copolymer is temporarily precipitated or in a state of being close thereto. A correct value is not obtained as the measurement is conducted before the test solution becomes uniform when the stirring time is 1 hour or shorter. On the other hand, there is a possibility that the composition of the solution changes to be different from that in the initial stage as the volatilization of the good solvent and the poor solvent gradually occurs during stirring when the stirring time is 8 hours or longer.

In addition, the difference in stirring time is desirably within 1 hour and even more desirably within 30 minutes in the case of comparing two or more kinds of copolymers.

The preparation and stirring temperature of the test solution are not particularly limited, but the stirring temperature is preferably from 15 to 35° C. and more preferably from 20 to 30° C. It is preferable that the adjustment and stirring of the test solution are conducted at the same temperature since the solubility of the copolymer in a solvent varies depending the solution temperature, and thus it is preferable that the adjustment and stirring of the test solution are conducted at a temperature near room temperature at which the temperature is easily stabilized.

In addition, in order to conduct an accurate measurement, the adjustment and stirring of the test solution are conducted at a temperature preferably in a range of the specified temperature±3° C., more preferably in a range of the specified temperature±2° C., and even more preferably in a range of the specified temperature±1° C.

It is preferable to lower the temperature by 1.0° C. and more preferably by 0.5° C. In addition, in order to achieve this temperature lowering width, it is preferable to use a thermostatic bath of which the temperature can be set by 0.1° C.

In addition, it is desirable to have an identical temperature in each step of adjustment, stirring, and temperature lowering of the test solution in the case of comparing two or more kinds of copolymers.

(Second Aspect)

<Copolymer for Lithography (P)>

The copolymer for lithography of the second aspect of the invention (hereinafter, referred to as the copolymer (P) in some cases) is composed of the constitutional units $\alpha'_1$ to $\alpha'_n$ (however, $\alpha'_1$ to $\alpha'_n$ represent the constitutional units derived from the monomers $\alpha_1$ to $\alpha_n$, respectively. n is an integer 2 or more.), and the constitutional units $\alpha'_1$ to $\alpha'_n$ include at least one constitutional unit which contains an acid leaving group and at least one constitutional unit which does not contain an acid leaving group. In other words, the copolymer (P) is a copolymer obtained by polymerizing at least one monomer unit which contains an acid leaving group and at least one monomer which does not contain an acid leaving group.

The upper limit of n is preferably 6 or less from the viewpoint of easily obtaining the effect of the invention. It is more preferably 5 or less and even more preferably 4 or less particularly in a case in which the copolymer (P) is a copolymer for resist.

In other words, n is preferably 2 or more and 6 or less, more preferably 2 or more and 5 or less, and even more preferably 2 or more and 4 or less.

The copolymer for lithography (P) may be one containing an acid leaving group, and examples thereof may include a copolymer for resist used in the formation of a resist film and a copolymer for antireflective coating used in the formation of an antireflective coating (TARC) formed on the upper layer of a resist film or an antireflective coating (BARC) formed on the lower layer of a resist film.

The copolymer (P) is obtained by polymerizing the monomers $\alpha_1$ to $\alpha_n$ which correspond to the constitutional units $\alpha'_1$ to $\alpha'_n$, respectively. The monomer is a compound having a polymerizable multiple bond. The polymerizable multiple bond is a multiple bond that is cleaved at the time of the polymerization reaction to form a copolymer chain, and it is preferably an ethylenic double bond. The monomer is preferably a compound having a vinyl group, and it is preferably those which are easily radical polymerized. In particular, (meth)acrylic ester is preferable from the viewpoint of being highly transparent with respect to exposure light having a wavelength of 250 nm or less.

[Constitutional Unit and Monomer Having Acid Leaving Group]

Examples of the monomer having an acid leaving group may include the same compound as the monomer having an acid leaving group mentioned in the first aspect.

In addition, the content of the constitutional unit having an acid leaving group is the same as the content of the constitutional unit having an acid leaving group mentioned in the first aspect.

Preferred examples of the constitutional unit derived from a (meth)acrylic acid ester that is a monomer having an acid leaving group and has an alicyclic hydrocarbon group having from 6 to 20 carbon atoms and an acid leaving group may include the same constitutional units as the constitutional units represented by Formula (i) to (iv) above.

Preferred examples of the monomer having an acid leaving group particularly in the case of manufacturing a resist composition applied in the pattern forming method to expose to light having a wavelength of 250 nm or less may include the same monomers as the "preferred examples of the monomer having an acid leaving group" mentioned in the first aspect.

[Constitutional Unit and Monomer which do not Contain Acid Leaving Group]

The constitutional unit which does not contain an acid leaving group in the copolymer for lithography (P) is not particularly limited, and a constitutional unit that is known in the field of copolymers for lithography can be appropriately selected and used depending on the application or required characteristics, and examples thereof may include the "constitutional unit and monomer which do not contain acid leaving group" mentioned in the first aspect.

In a case in which the copolymer (P) is a copolymer for resist, it is preferable to have a constitutional unit containing a polar group as the constitutional unit which does not contain an acid leaving group, and further it is possible to have a known constitutional unit which does not contain an acid leaving group other than this if necessary.

The ratio of the constitutional unit having an acid leaving group in the copolymer for resist is the same as the ratio mentioned in the first aspect.

The weight average molecular weight (Mw) of the copolymer for resist is the same as the weight average molecular weight mentioned in the first aspect, and the preferred examples are also the same.

[Constitutional Unit and Monomer having Polar Group]

Examples of the constitutional unit and the monomer which have a polar group may include the same constitutional units and monomers as the "constitutional unit and monomer having polar group" mentioned in the first aspect.

[Constitutional Unit and Monomer having Lactone Skeleton]

Examples of the constitutional unit and the monomer which have a lactone skeleton may include the same constitutional units and monomers as the "constitutional unit and monomer having lactone skeleton" mentioned in the first aspect.

In a case in which the copolymer for resist contains a constitutional unit having a lactone skeleton, the content thereof is the same as the content mentioned in the first aspect.

Specific examples of the monomer having a lactone skeleton may include the same monomers as the specific examples of the monomer having a lactone skeleton mentioned in the first aspect.

As the monomer having a lactone skeleton, β-γ-butyrolactone(meth)acrylate, α-γ-butyrolactone(meth)acrylate, 5-methacryloyloxy-2,6-norbornanecarbolactone, and 8-methacryloxy-4-oxatricyclo[$5.2.1.0^{2,6}$]decane-3-one are preferable.

The monomer having a lactone skeleton may be used singly or in combination of two or more kinds thereof.

[Constitutional Unit and Monomer having Hydrophilic Group]

Examples of the constitutional unit and the monomer which have a hydrophilic group may include the same constitutional units and monomers as the "constitutional unit and monomer having hydrophilic group" mentioned in the first aspect.

In addition, the hydrophilic group may be those which contain a linking group containing a fluorine group or the like, for example, as a group represented by $-C(CF_3)_2-OH$.

The content of the constitutional unit having a hydrophilic group in the copolymer for resist is the same as the content mentioned in the first aspect.

As the monomer having a hydrophilic group, 3-hydroxyadamantyl methacrylate, 2- or 3-cyano-5-norbornyl(meth)acrylate, and 2-cyanomethyl-2-adamantyl methacrylate are more preferable.

The monomer having a hydrophilic group may be used singly or in combination of two or more kinds thereof.

<Method for Manufacturing Copolymer>

[Polymerization Initiator]

Examples of the polymerization initiator used in the method for manufacturing a copolymer for lithography (P) of the invention may include the same polymerization initiators as the polymerization initiators mentioned in the first aspect. These are available as commercial products. It is possible to suitably use, for example, dimethyl-2,2'-azobis(isobutyrate) (V601 (trade name) manufactured by Wako Pure Chemical Industries, Ltd., 10 hours half-life temperature: 66° C.) and 2,2'-azobis(2,4-dimethylvaleronitrile) (V65 (trade name) manufactured by Wako Pure Chemical Industries, Ltd., 10-hour half-life temperature: 51).

[Solvent]

Examples of the polymerization solvent in the method for manufacturing a copolymer for lithography (P) of the invention may include the same polymerization solvent as the polymerization solvent mentioned in the first aspect.

<Division of Copolymer (P) by GPC>

In the copolymer for lithography (P) of an embodiment of the invention, $N(v_1)/N_{ave}$ is from 1.0 to 1.09 where the ratio of the number of moles of the constitutional unit containing an acid leaving group with respect to the number of total moles of the constitutional units constituting the copolymer contained in the first fraction that is most previously eluted among five fractions of the eluate divided in order of elution so as to have equal volumes, the elute providing a peak attributed to the copolymer (P) in the elution curve obtained by gel permeation chromatography (GPC), is denoted as $N(v_1)$ mol % and the ratio of the number of moles of the constitutional unit containing an acid leaving group with respect to the number of total moles of the constitutional units constituting the copolymers contained in all of the five fractions is denoted as $N_{ave}$ mol %.

In addition, it is preferable that $N(v_2)/N_{ave}$, $N(v_3)/N_{ave}$, and $N(v_4)/N_{ave}$ are from 0.95 to 1.05, respectively, where the ratio of the number of moles of the constitutional unit containing an acid leaving group with respect to the number of total moles of the constitutional units constituting the copolymer contained in each of the fractions which are eluted from secondly to fourthly are denoted as $N(v_2)$ mol %, $N(v_3)$ mol %, and $N(v_4)$ mol %, respectively.

FIG. 1 is a diagram schematically illustrating an example of the elution curve obtained by GPC, in which the horizontal axis represents the elution volume V (namely, elution speed×elution time) represented by the accumulated value of the eluate which flows out from the column to pass through the detector and the vertical axis represents the signal intensity detected when the eluate passes through the detector. In general, the log of the molecular weight of the copolymer in the eluate passing through the detector monotonously decreases as the elution volume V increases in the case of measuring the molecular weight distribution of the copolymer using GPC. In other words, a substance is eluted earlier from the column as the molecular weight thereof is higher. In addition, the signal intensity is proportional to the abundance of the copolymer in the eluate passing through the detector.

The term "eluate providing a peak attributed to the copolymer in the elution curve obtained by GPC" in the invention means the eluate which contains a copolymer and passes through the detector from the peak start (indicated by reference numeral Ps in the drawing) to the peak end (indicated by reference numeral Pe in the drawing) of the signal intensity in the elution curve.

Incidentally, a base line B connecting the peak start to the peak end in the elution curve is drawn on the elution curve, and the intersection of the elution curve on the side having a smaller elution volume with the base line B is denoted as Ps and the intersection of the elution curve on the side having a greater elution volume with the base line is denoted as Pe.

In addition, the expression "eluate providing a peak is divided into five fractions so as to have equal volumes in order of elution" means that the elution volume V from the peak start Ps to the peak end Pe is equally divided into five in order of elution as indicated by a broken line in FIG. 1, and the eluates corresponding to the respective elution volumes after the division are separately taken as a fraction, respectively. In other words, in the example of FIG. 1, five fractions of the fraction 1 obtained between the elution volumes V1 and V2, the fraction 2 obtained between the elution volumes V2 and V3, and the fraction 5 obtained between the elution volumes V5 to V6 are separately taken, respectively.

In order to determine $N(v_1)$, preferably the copolymer composition (ratio of the respective constitutional units) of the copolymer contained in the first fraction that is most previously eluted among the five fractions is determine and the ratio of the constitutional unit containing an acid leaving group in the copolymer composition is denoted as $N(v_1)$ mol %. The copolymer composition of the copolymer in one fraction (hereinafter, referred to as the fractionated copolymer composition in some cases) can be measured by analyzing the separately taken fraction using $^1$H-NMR. $N(v_1)$ is the average value in one fraction. In a case in which there are two or more kinds of constitutional units containing an acid leaving group, the sum of the ratios thereof in the copolymer composition is denoted as $N(v_1)$ mol %.

The fraction that is most previously eluted is the fraction 1 obtained between the elution volumes V1 and V2 in FIG. 1. In GPC, a substance is eluted earlier from the column as the molecular weight thereof is higher, and thus the copolymer in the fraction 1 has the highest average molecular weight among the fractions 1 to 5.

$N(v_2)$, $N(v_3)$, and $N(v_4)$ can also be determined in the same manner.

In order to determine $N_{ave}$, preferably the copolymer composition of the copolymer contained in the sum of the five fractions is determined and the ratio of the constitutional unit containing an acid leaving group in the copolymer composition is denoted as $N_{ave}$ mol %. $N_{ave}$ is the average value in the entire copolymer (P). In a case in which there are two or more kinds of constitutional units containing an acid leaving group, the sum of the ratios thereof in the copolymer composition is denoted as $N_{ave}$ mol %.

The fact that $N(v_1)/N_{ave}$ is from 1.01 to 1.09 means that the ratio of the constitutional unit containing an acid leaving group in the copolymer composition is slightly higher than the overall average ($N_{ave}$) in the copolymer in the fraction 1 having a greater molecular weight.

The fact that $N(v_2)/N_{ave}$, $N(v_3)/N_{ave}$, and $N(v_4)/N_{ave}$ are respectively from 0.95 to 1.05 means that the ratios of the constitutional units containing an acid leaving group in the copolymer compositions in the copolymers in the fractions 2 to 4 are about the same as the overall average ($N_{ave}$).

In general, a copolymer has the molecular weight distribution, and thus the solubility thereof in a solvent is not uniform and a component that is likely to exhibit insufficient solubility in a developing solution when being used in a resist composition is present in the copolymer.

In the copolymer having a constitutional unit containing an acid leaving group, the solubility in a solvent such as a developing solution depends on (i') the molecular weight of the copolymer and (ii') the amount of the constitutional unit containing an acid leaving group in the copolymer chain (namely, a component of which the solubility increases as the bond is cleaved by an acid).

With regard to (i'), the dissolution speed of the copolymer in a solvent is slower as the molecular weight thereof is higher and, in contrast, the dissolution speed is faster as the molecular weight is lower in a case in which the ratios of the constitutional units having an acid leaving group in the copolymer compositions are the same.

With regard to (ii'), an acid leaving group contributes to an increase in dissolution speed of the copolymer chain in a resist solvent or an organic solvent such as a negative type developing solution in a state in which the bond of the acid leaving group is not cleaved by an acid and the dissolution speed of the copolymer chain in an alkaline aqueous solution such as a positive type developing solution dramatically increases as the bond of the acid leaving group is cleaved by an acid. Hence, the dissolution speed of a copolymer chain in a developing solution is faster as the ratio of the constitutional unit having an acid leaving group is higher and the dissolution speed of a copolymer chain in a developing solution is slower as the ratio of the constitutional unit having an acid leaving group is lower in the copolymer chains having the same molecular weight.

In the copolymer (P) in which $N(v_1)/N_{ave}$ is 1.01 or more, more acid leaving groups are contained in the molecular chain of the copolymer in the first fraction having the highest molecular weight among the fractions 1 to 5. Hence, in the higher molecular weight substance in the copolymer (P), a slow dissolution speed (the action of (i') above) due to a higher molecular weight is compensated by a fast dissolution speed (the action of (ii') above) due to a greater amount of acid leaving group, and thus the solubility of the higher molecular weight substance is selectively improved. As a result, the solubility of the copolymer (P) in a solvent is improved as a whole.

Meanwhile, in a case in which the effect of (ii') above is greater than the effect of (i') above, that is, an acid leaving group is excessively contained in the molecular chain of the copolymer in the fraction 1, the dissolution speed of the higher molecular weight substance in the copolymer (P) is too fast and thus the solubility of the copolymer (P) in a solvent tends to be non-uniform as a whole. In addition, the solubility in a component exhibiting higher polarity than a resist solvent or an organic solvent such as a negative type developing solution significantly deteriorates, and thus there is a tendency that the compatibility of the copolymer (P) with another mixture deteriorates in the case of using the copolymer (P) as a resist composition and the dissolution stability at a low temperature environment or during long-term storage deteriorates.

When $N(v_1)/N_{ave}$ is 1.09 or less, non-uniformity of solubility of the copolymer (P) due to the fact an acid leaving group is excessively contained in the copolymer in the fraction 1 is favorably suppressed and thus the copolymer (P) exhibiting favorable and uniform solubility in a solvent as a whole can be obtained.

In the copolymer (P) of the invention, properly many acid leaving groups are present on the higher molecular weight side, and thus a decrease in dissolution speed in a solvent due to a higher molecular weight of the copolymer chain is compensated by an increase in dissolution speed due to a higher composition distribution of the constitutional unit having an acid leaving group so that the solubility of the copolymer in a solvent is improved and the uniformity of dissolution speed is improved.

Hence, the uniformity of solubility and dissolution speed in a developing solution is improved in the case of using the copolymer (P) of the invention in a chemically amplified resist composition, and thus a highly sensitive chemically amplified resist composition can be obtained.

The method for manufacturing a copolymer (P) satisfying that $N(v_1)/N_{ave}$ is from 1.01 to 1.09 is not particularly limited, but examples thereof may include a method by polymerization, a method in which a copolymer having the desired copolymer composition and molecular weight is removed by a cleaning or separation operation, and a method in which polymers having different copolymer composition distributions and molecular weight distributions are mixed together. The manufacturing method by polymerization is preferable from the viewpoint of obtaining the copolymer (P) at a favorable productivity by one time of polymerization reaction.

<Turbidity of Copolymer (P)>

The copolymer (P) of an embodiment of the invention is a copolymer in which the turbidity Th'(80) of a PGMEA solution is 1.0 NTU or more and 4.7 NTU or less when n-heptane in an amount to be 80% of (X')h (mass %, the amount of n-heptane added to the total mass of the PGMEA solvent) is added to the PGMEA solution where (X')h denotes the amount of n-heptane added to have a turbidity of 10 NTU when n-heptane is added to the PGMEA solution containing the copolymer (P) at 20 wt % with respect to the total mass of the PGMEA solution. Th'(80) is preferably 1.0 or more and 4.6 or less, more preferably 1.0 or more and 4.5 or less, even more preferably 1.3 or more and 4.4 or less, and even more preferably 1.6 or more and 4.3 or less from the viewpoint of high solubility in PGMEA solvent and of being able to be suitably used as a material for lithography.

A solution obtained by adding n-heptane to a PGMEA solution in which the content of the copolymer (P) is 20 wt % with respect to the total mass of the PGMEA solution is adjusted to 25° C., stirred for 4 hours, and then subjected to the measurement of turbidity.

It is possible to use, for example, the TB200 manufactured by Orbeco-Hellige, Inc for the measurement of turbidity, and the turbidity can be measured by adjusting the solution temperature to 25° C.

The copolymer (P) of an embodiment of the invention is a copolymer in which the turbidity Tm'(80) of a PGMEA solution is 1.0 NTU or more and 3.9 NTU or less when methanol in an amount to be 80% of (X')m (mass %, the amount of methanol added to the total mass of the PGMEA solvent) is added to the PGMEA solution where the (X')m denotes the amount of methanol added to have a turbidity of 5.0 NTU when methanol is added to the PGMEA solution containing the copolymer (P) at 20 wt % with respect to the total mass of the PGMEA solution. Tm'(80) is preferably 1.2 or more and 3.8 or less, more preferably 1.4 or more and 3.7 or less, even more preferably 1.6 or more and 3.6 or less, and even more preferably 1.8 or more and 3.5 or less from the viewpoint of high solubility in PGMEA solvent and of being able to be suitably used as a material for lithography.

The turbidity Th'(80) and Tm'(80) can be measured under the same conditions as the conditions (1) to (8) mentioned in the first aspect.

The copolymer (P) of the invention exhibits excellent dissolution stability in a solvent as an increase in turbidity is gentle in both of the case of adding n-heptane which exhibits lower polarity than PGMEA to a PGMEA solution in which the content of the copolymer (P) is 20 wt % with respect to the total mass of the PGMEA solution and the case of adding methanol exhibits higher polarity than PGMEA thereto.

The method for manufacturing a copolymer (P) satisfying that the turbidity Th'(80) is 4.7 NTU or less and the turbidity Tm'(80) is 3.9 NTU or less is not particularly limited, but examples thereof may include a manufacturing method by the polymerization reaction described above, a method in which a copolymer having the desired copolymer composition and molecular weight is removed by cleaning or separation operation, and a method in which copolymers having different copolymer composition distributions and molecular weight distributions are mixed together. The manufacturing method by the polymerization reaction described above is preferable from the viewpoint of obtaining the copolymer at a favorable productivity by one time of polymerization reaction.

<Method for Evaluating Low Temperature Solubility>

The low temperature solubility of the copolymer (P) of an embodiment of the invention can be evaluated by the same method for evaluating low temperature solubility as the "method for evaluating low temperature solubility" mentioned in the first aspect.

<Evaluation of Copolymer (P) by Dynamic Light Scattering Method>

The particle size distribution of the copolymer (P) of an embodiment of the invention can be evaluated by a dynamic light scattering (DLS) method.

Specifically, the particle size distribution is evaluated by the DLS method for a 20 wt % solution prepared by dissolving the copolymer (P) in a good solvent (namely, the PGMEA solution in which the content of the copolymer (P) is 20 wt % with respect to the total mass of the PGMEA solution).

The "good solvent" is a solvent that can dissolve the copolymer (P), and a known solvent can be used. For example, it is possible to use the solvent mentioned as the polymerization solvent to be described later. In the case of using the copolymer (P) in the manufacture of a resist composition, it is preferable to evaluate the copolymer (P) by using the same solvent as the resist solvent in the resist composition as a good solvent.

As the "evaluation by DLS method", for example, it is possible to evaluate the copolymer (P) by measuring the particle size distribution using the FPAR-1000 of a highly sensitive specification (manufactured by OTSUKA ELECTRONICS, Co., LTD.) equipped with a dilute system probe and analyzing the autocorrelation function obtained by the measurement by the Marquardt method to obtain a particle size distribution curve.

In the copolymer (P), it is preferable that the peak top of a peak attributed to the copolymer (P) is one point in the particle size distribution curve obtained by the dynamic light scattering (DLS) method. The "peak top" in the invention is the point at which the particle size distribution curve has the maximum value.

<Method for Manufacturing Copolymer>

The method for manufacturing a copolymer for lithography of the present embodiment is a preferred method for manufacturing the copolymer (P) of an embodiment of the invention. Examples of a suitable method for manufacturing the copolymer (P) may include the same manufacturing method as "an embodiment of the method for manufacturing a copolymer" described in the first aspect.

In addition, in the present embodiment, a solution Sa (a is from 1 to d, and d is an integer 1 or more and 5 or less) containing a monomer and a solution Tb (b is from 1 to e, and e is an integer 1 or more and 4 or less) containing a monomer are used. The solutions Sa and Tb preferably contain a solvent.

The compositions of the solution Sa and the solution Tb are the same as the "compositions of solution Sa and solution Tb" mentioned in the first aspect.

[Supply of Polymerization Initiator]

The supply of the polymerization initiator is the same as the "supply of polymerization initiator" mentioned in the first aspect.

[Content of Monomer in Solution Sa]

The content of the monomer in the solution Sa is the same as the "content of monomer in solution Sa" mentioned in the first aspect.

[Supply of Solution Sa and Solution Tb]

The supply of the solution Sa and the solution Tb are the same as the description on the "supply of solution Sa and solution Tb" in the first aspect.

[Supply Speed of Polymerization Initiator]

The dropwise addition of the polymerization initiator in the polymerization step may be conducted until the dropwise addition of the solution Tb is completed or may be completed before it. The dropwise addition of the polymerization initiator is preferably conducted until the dropwise addition of the solution Tb is completed. It is preferable that the molecular weight of the copolymer to be produced at each moment gently decreases from the initial stage to the later stage of the polymerization from the viewpoint of easily obtaining a copolymer (P) in which $N(v_1)/N_{ave}$ is in the range of the invention or a copolymer (P) in which the relation between the molecular weight distribution and the composition distribution satisfies the following Equation (1).

Incidentally, it is preferable that the copolymer (P) of an embodiment of the invention satisfies that $N(v_1)/N_{ave}$ is from 1.01 to 1.09 and satisfies the following Equation (1).

[Mathematical Formula 1]

$$0.05 \leq (Sw-Sc)/Sc \times 100 \leq 0.75 \quad (1)$$

(In Formula (1) above, Sw is a value represented by the following Formula (2), and Sc is a value represented by the following Formula (3).)

[Mathematical Formula 2]

$$S_w = \frac{\sum_{j=1}^{m} W(v_j)N(v_j)A(v_j)}{\sum_{j=1}^{m} W(v_j)A(v_j)} \quad (2)$$

$$S_c = \frac{\sum_{j=1}^{m} N(v_j)A(v_j)}{\sum_{j=1}^{m} A(v_j)} \quad (3)$$

In Formula (2) and Formula (3) above, m is 5; $N(v_j)$ represents the ratio [unit:mol %] of the constitutional unit containing an acid leaving group to the number of total moles of the constitutional units that constitute the copolymer contained in each of the five fractions, $A(v_j)$ represents the ratio [unit:%] of the area value of each fraction to the sum of the area values of all the fractions in the elution curve, and $W(v_j)$ represents the weight average molecular weight of the copolymer contained in each of the five fractions.

Formula (1) is calculated using the ratio $N(v_j)$ [unit:mol %] of the constitutional unit containing an acid leaving group to the number of total moles of the constitutional units that constitute the copolymer contained in each fraction of the five fractions 1 to 5; the ratio (hereinafter, referred to as the area value ratio in some cases) $A(v_j)$ [unit:%] of the area value of each fraction to the sum of the area values of all the fractions in the elution curve, and the weight average molecular weight $W(v_j)$ of the copolymer contained in each fraction of the five fractions 1 to 5.

In order to determine $N(v_j)$, preferably the copolymer composition in each fraction is measured by the analysis using $^1$H-NMR for each of the fractions 1 to 5 in the same manner as $N(v_1)$, and the ratio of the constitutional unit containing an acid leaving group in the copolymer composition is denoted as $N(v_j)$ mol %.

The area value ratio $A(v_1)$ is a ratio of the area value of each fraction to the sum of the area values of all the fractions. The term "area value in the elution curve" means the area between the elution curve and the base line B. For example, the shaded portion in FIG. 1 is the area value of the fraction 2, and the ratio (namely, area value ratio $A(v_2)$) of the area value of the fraction 2 to the sum of the area values of all the fractions is a value obtained by (Area value of fraction 2/sum of area values of fractions 1 to 5)×100[unit: %].

The area value ratio $A(v_j)$ in the elution curve is calculated using, for example, a chromatographic data collection system JDS-300 developed by Japan Analytical Industry Co., Ltd. as the j-th peak area ratio when the elution curve is divided into five so as to have equal elution volumes. The area value ratio $A(v_j)$ is proportional to the abundance ratio of the copolymer in each fraction. As the GPC detector, a differential refractometer and an evaporative type light scattering detector are preferable and a differential refractometer is even more preferable from the viewpoint of the proportional precision between the area ratio $A(v_j)$ and the abundance ratio of the copolymer in each fraction.

As the weight average molecular weight $W(w_j)$, the weight average molecular weight of each fraction is determined in terms of polystyrene.

The denominator of Sc represented by Formula (3) above represents the total amount of the copolymer (P); and the numerator of Sc is the sum of the product of the average value [mol %] of the ratios of the monomer unit containing an acid leaving group in each fraction and the proportion (%) of the amount respect to the total amount of the copolymer (P). Hence, Sc represents the average value ($=N_{ave}$) of the ratios of the constitutional unit containing an acid leaving group to the total amount of the copolymer (P).

Sw represented by Formula (2) above is a value obtained by weighting Formula (3) above by the weight average molecular weight $(W(v_j))$. In other words, Sw represents the average value (weighted average) obtained by weighting the ratio of the constitutional unit containing an acid leaving group to the total amount of the copolymer (P) by the weight average molecular weight.

Hence, the fact that $(Sw-Sc)/Sc \times 100$ of Formula (1) above is greater than zero means that the constitutional unit containing an acid leaving group is present more on the higher molecular weight side than the lower molecular weight side.

When $(Sw-Sc)/Sc \times 100$ of Formula (1) above is 0.05 or more, a slow dissolution speed (namely, the action of (i) above) due to a higher molecular weight is compensated by a fast dissolution speed (namely, the action of (ii) above) due to a greater amount of acid leaving group on the higher molecular weight side of the copolymer (P), and thus the solubility of the copolymer (P) in a solvent is improved as a whole.

In addition, it is more preferable to use $(Sw-Sc)/Sc \times 100$ as an indicator since the degree of bias of the acid leaving group can be evaluated throughout the entire molecular weight region as compared to a case in which $N(v_1)/N_{ave}$ is used as an indicator.

It is preferable that $(Sw-Sc)/Sc \times 100$ of Formula (1) above is 0.1 or more from the viewpoint of easily obtaining more favorable solubility in a solvent such as a solvent for resist, a negative type developing solution, or a rinsing liquid and also easily obtaining more favorable solubility in a solvent such as a positive type developing solution after the acid leaving group is cleaved by an acid.

Meanwhile, when the bias of the monomer unit containing an acid leaving group toward the higher molecular weight side is too great, the dissolution speed in a solvent is too fast in the higher molecular weight substance in the copolymer (P), and thus the solubility of the copolymer (P) in a solvent tends to be non-uniform as a whole. From the viewpoint of favorably suppressing the non-uniformity of solubility and easily obtaining a copolymer (P) exhibiting favorable and uniform solubility in a solvent as a whole, (Sw−Sc)/Sc×100 of Formula (1) above is preferably 0.75 or less and more preferably 0.50 or less.

[Preferred Aspect of Polymerization Step]

A preferred aspect of the polymerization step is the same as the "preferred aspect of polymerization step" mentioned in the first aspect.

<Method for Designing First Composition of Solution Sa (the First Method)>

Examples of the method for designing the first composition of the solution Sa (the first method) may include the same method as the "method for designing first composition of solution Sa (the first method)" mentioned in the first aspect.

Incidentally, according to the present method, a copolymer molecule which has a higher molecular weight and contains more acid leaving groups is produced in the initial stage of the polymerization and the steady state is then obtained, and thus it is possible to obtain a copolymer (P) in which $N(v_1)/N_{ave}$ is in the range of the invention or a copolymer (P) in which the relation between the molecular weight distribution and the composition distribution satisfies Equation (1) above.

<Method for Designing First Composition of Solution Sa (Second Method)>

Examples of the method for designing the first composition of the solution Sa (the second method) may include the same method as the "method for designing first composition of solution Sa (second method)" mentioned in the first aspect.

Incidentally, as the ordinal number of the factor F, it is required to increase the divisor in order to increase the molecular weight and to contain more acid leaving groups in the initial stage of polymerization, but the divisor is even more preferably 3 so that Formula (1) above representing the degree of bias corresponds to the range of from 0.1 to 0.5.

<Resist Composition>

The resist composition of an embodiment of the present invention is prepared by dissolving the copolymer for lithography (P) of an embodiment of the invention in a resist solvent. Examples of the resist solvent may include the same solvent as the polymerization solvent in the manufacture of the copolymer.

A compound (hereinafter, referred to as the photoacid generator) which generates an acid by irradiation of an actinic ray or radiation is further contained in a case in which the resist composition of the invention is a chemically amplified resist composition.

(Photoacid Generator)

Examples of the photoacid generator may include the same photoacid generator as the "photoacid generator" mentioned in the first aspect.

(Nitrogen-Containing Compound)

Examples of the nitrogen-containing compound may include the same nitrogen-containing compound as the "nitrogen-containing compound" mentioned in the first aspect.

(Organic Carboxylic Acid and Oxo Acid of Phosphorus or Derivative Thereof)

The organic carboxylic acid and oxo acid of phosphorus or a derivative thereof may include the same organic carboxylic acid and oxo acid of phosphorus or derivative thereof as the "organic carboxylic acid and oxo acid of phosphorus or derivative thereof" mentioned in the first aspect.

(Additive)

Examples of the additive may include the same additive as the "additive" mentioned in the first aspect.

<Method for Manufacturing Substrate having Pattern Formed Thereon>

Examples of the method for manufacturing a substrate on which a pattern is formed may include the same method for manufacturing a substrate on which a pattern is formed as the "method for manufacturing substrate having pattern formed thereon" mentioned in the first aspect.

The [development] and [developing solution] are the same as the "development" and "developing solution" mentioned in the first aspect.

The copolymer for lithography obtained by the manufacturing method of the invention exhibits excellent solubility in a solvent and can form a resist film exhibiting uniform solubility in a developing solution and high sensitivity when being used in a resist composition.

Hence, it is possible to easily and favorably dissolve the copolymer in a resist solvent when preparing a resist composition.

In addition, in the case of a positive type resist composition, it exhibits excellent solubility in an alkaline developing solution and contributes to the improvement in sensitivity. In addition, a defect due to the insoluble matter is less likely to generate in the pattern formation since the resist composition contains a smaller amount of insoluble matter.

In the case of a negative type resist composition, it exhibits excellent solubility in an organic solvent that is a negative type developing solution and contributes to the improvement in sensitivity. In addition, a defect due to the insoluble matter is less likely to generate in the pattern formation since the resist composition contains a smaller amount of insoluble matter.

Hence, according to the method for manufacturing a substrate of an embodiment of the invention, it is possible to stably form a highly precise fine resist pattern having fewer defects on a substrate by using the resist composition of the invention. In addition, the resist composition can also be suitably used in the pattern formation by photolithography using exposure light having a wavelength of 250 nm or less or electron beam lithography, for example, lithography using ArF excimer laser (193 nm) which requires the use of a resist composition exhibiting high sensitivity and high resolution.

Incidentally, it is preferable to appropriately select and use the monomer so that the copolymer is transparent at the wavelength of exposure light in the case of manufacturing a resist composition to be used in photolithography using exposure light having a wavelength of 250 nm or less.

Another aspect of the copolymer for lithography of the invention is that the weight average molecular weight is from 1,000 to 100,000 and the content of the constitutional unit having an acid leaving group is 20 mol % or more and 60 mol % or less with respect to the number of total moles of the constitutional units constituting the copolymer.

EXAMPLES

Hereinafter, the invention will be described in more detail with reference to Examples, but the invention is not limited to these Examples.

(First Aspect)

Example 1A

A copolymer A-1 was synthesized using the mix proportion described in Table 1A by the following synthetic procedure.

The solvent and polymerization initiator used in the synthesis of the copolymer are as follows.

Solvent (S)
S-1: ethyl lactate
S-3: methanol
S-4: water
Polymerization Initiator (R)
R-1: dimethyl-2,2'-azobisisobutyrate (V-601 (trade name) manufactured by Wako Pure Chemical Industries, Ltd.)
The monomers (M-1) to (M-3) used in the synthesis of the copolymer are as follows.

[Chem. 3]

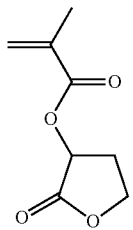
(M-1)

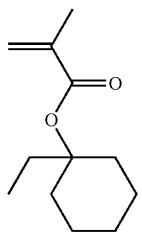
(M-2)

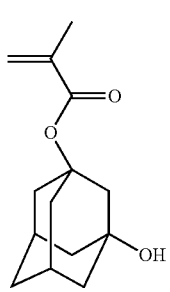
(M-3)

M-1: α-GBLMA (α-γ-butyrolactone methacrylate)
M-2: ECHMA (1-ethylcyclohexyl methacrylate)
M-3: HAdMA (3-hydroxy-1-adamantyl methacrylate)

(Step 1) In a flask equipped with a nitrogen inlet, a stirrer, a condenser, two dropping funnels, and a thermometer, a mixed solution prepared at the mixing ratio described at the Step 1 part in Table 1A was charged in a nitrogen atmosphere, and the temperature of the hot water bath was raised to 80° C. while stirring. The mixing ratio is a composition determined in advance by taking the target composition in each copolymer and the reactivity of each monomer used in the polymerization into consideration.

(Step 2) A mixed solution prepared at the mixing ratio described at the Step 2 part in Table 1A was added to the flask dropwise through one dropping funnel over 4 hours at a constant speed and then held for 3 hours at a temperature of 80° C.

(Step 3) A mixed solution prepared at the mixing ratio described at the Step 3 part in Table 1A was added to the flask dropwise through the other dropping funnel over 0.1 hour at the same time as the start of dropwise addition of the mixed solution in Step 2. The weight average molecular weight of the copolymer to be produced in the initial stage of the polymerization step changes depending on the amount of the polymerization initiator to be dropped in the present step, but it is set to be closer to the target weight average molecular weight of each copolymer.

(Step 4) Subsequently, a mixed solvent prepared at the mixing ratio described at the Step 4 part in Table 1A was prepared to be about 7 times the amount of the reaction solution obtained was added to the reaction solution dropwise while stirring to obtain a precipitate of a white gel substance, and the precipitate was separated through filtration.

(Step 5) A mixed solvent prepared at the mixing ratio described at the Step 5 part in Table 1A was prepared to be the same amount as in Step 4, the precipitate separated through filtration was charged into this mixed solvent. This was separated through filtration, recovered, and dried for about 40 hours at 60° C. under reduced pressure, thereby obtaining a powder of each copolymer.

Comparative Example 1A

A copolymer A-2 was synthesized by the same procedure as in Example 1A but changing the mix proportion to that for Comparative Example 1A described in Table 1A.

Comparative Example 2

A copolymer A-3 was synthesized by the same procedure as in Example 1A but changing the mix proportion to that for Comparative Example 2A described in Table 1A.

TABLE 1A

|  |  | Step 1 (parts by mass) | | | | Step 2 (parts by mass) | | | | | Step 3 (parts by mass) | | Step 4 (volume ratio) | | Step 5 (volume ratio) | |
| --- | --- | --- | --- | --- | --- | --- | --- | --- | --- | --- | --- | --- | --- | --- | --- | --- |
|  |  | S-1 | M-1 | M-2 | M-3 | S-1 | M-1 | M-2 | M-3 | R-1 | S-1 | R-1 | S-3 | S-4 | S-3 | S-4 |
| Example 1A | Copolymer A-1 | 87.0 | 1.6 | 7.3 | 1.2 | 105.0 | 28.1 | 28.6 | 19.5 | 1.8 | 9.2 | 0.6 | 80 | 20 | 85 | 15 |
| Comparative Example 1A | Copolymer A-2 | 72.6 | — | — | — | 130.7 | 30.6 | 35.3 | 21.2 | 2.6 | — | — | 80 | 20 | 85 | 15 |
| Comparative Example 2A | Copolymer A-3 | 87.2 | — | 10.2 | — | 105.1 | 28.8 | 27.0 | 20.4 | 1.8 | 9.2 | 0.6 | 80 | 20 | 85 | 15 |

Synthesis of Copolymer A-1

The composition ratio of the constitutional units in the molecule design is α-GBLMA:ECHMA:HAdMA=40:40:20 (mol %).

(Weight Average Molecular Weight of Copolymer for Lithography)

The weight average molecular weight (Mw) and molecular weight distribution (Mw/Mn) for Example 1A, Comparative Example 1A, and Comparative Example 2A (copolymers A-1, A-2, and A-3) were measured by the following method.

A sample solution was prepared by dissolving about 20 mg of a sample in 5 mL of THF and filtering the solution through a 0.5 μm membrane filter, the weight average molecular weight (Mw) and number average molecular weight (Mn) of this sample solution were measured using a gel permeation chromatography (GPC) apparatus: HCL-8220 (product name) manufactured by TOSOH CORPORATION, and the molecular weight distribution (Mw/Mn) thereof was determined. In this measurement, one prepared by connecting three pieces of Shodex GPC LF-804L (product name) manufactured by SHOWA DENKO K.K. in series was used as the separation column, THF (tetrahydrofuran) was used as the solvent, the flow rate was 1.0 mL/min, a differential refractometer was used as the detector, the measurement temperature was 40° C., the injection volume was 0.1 mL, and polystyrene was used as the standard polymer. The measurement results are presented in Table 2A.

(Composition Ratio of Constitutional Units in Copolymer for Lithography)

The composition ratio (unit:mol %) of the respective constitutional units in the copolymer for lithography was determined through the measurement using $^1$H-NMR.

In this measurement, a superconducting FT-NMR of MODEL JNM-GX270 manufactured by JEOL Ltd. was used, about 5 mass % sample solutions (A-1 to A-3) (solution in which the solvent was deuterated dimethyl sulfoxide and the content of the copolymers (A-1 to A-3) were about 5 mass % with respect to the total mass of the sample solution) were charged in a sample tube having a diameter of 5 mm ϕ, respectively, and the integration of 64 times for $^1$H was conducted at an observation frequency of 270 MHz and the single pulse mode. The measurement temperature was 60° C. The measurement results are presented in Table 2A.

(Adjustment of Test Solution)

Test solutions A-1, A-2, and A-3 were prepared using the copolymers (A-1, A-2, and A-3) of Example 1A, Comparative Example 1A, and Comparative Example 2A at the mix proportion described in Table 3A.

TABLE 3A

| | | Copolymer | | Good solvent | |
| | | Kind | Amount (parts) | Kind | Amount (parts) |
|---|---|---|---|---|---|
| Example 1A | Test solution A-1 | A-1 | 20.0 | PGMEA | 80.0 |
| Comparative Example 1A | Test solution A-2 | A-2 | 20.0 | PGMEA | 80.0 |
| Comparative Example 2A | Test solution A-3 | A-3 | 20.0 | PGMEA | 80.0 |

(Measurement of Turbidity T (80))

To the test solutions A-1, A-2, and A-3, n-heptane or methanol was added in the amount presented in Table 4A, and the solution was stirred for 4 hours. After 4 hours of stirring, the turbidity of each solution was measured using a turbidity meter (TB200 manufactured by Orbeco-Hellige, Inc). The stirring and the measurement were conducted at 25° C. The measurement results are presented in Table 4A.

From this result, the amount of n-heptane added (X)h to have a turbidity of 10 NTU was determined through calculation using the measurement results of the turbidity for two points sandwiching the turbidity of 10 NTU, and the amount of n-heptane to be 80% of (X)h was determined. In addition, the amount of methanol added (X)m to have a turbidity of 5.0 NTU was determined through calculation using the measurement results of the turbidity for two points sandwiching the turbidity of 5.0 NTU, and methanol in an amount to be 80% of (X)m was determined. The results are presented in Table 5A.

Subsequently, n-heptane in an amount to be 80% of (X)h and methanol in an amount to be 80% of (X)m were added to 20 wt % PGMEA solutions of the copolymers of Example 1A and Comparative Examples 1A and 2A, respectively, and the solutions were stirred for 4 hours, and the turbidity of the solutions thus obtained was then measured using a turbidity meter. The results are presented in Table 6A.

TABLE 2A

| | | Mw | Mw/Mn | Composition ratio (mol %) | | |
| | | | | α-GBLMA | ECHMA | HAdMA |
|---|---|---|---|---|---|---|
| Example 1A | Copolymer A-1 | 10600 | 1.61 | 41 | 41 | 18 |
| Comparative Example 1A | Copolymer A-2 | 10100 | 1.66 | 41 | 41 | 18 |
| Comparative Example 2A | Copolymer A-3 | 10200 | 1.64 | 38 | 42 | 20 |

TABLE 4A

|  |  | n-heptane | | Methanol | |
|---|---|---|---|---|---|
|  |  | Amount added (wt % with respect to test solution) | Turbidity (NTU) | Amount added (wt % with respect to test solution) | Turbidity (NTU) |
| Example 1A | Copolymer A-1 | 9.0 | 2.7 | 20.0 | 1.4 |
|  |  | 13.9 | 6.0 | 40.0 | 1.8 |
|  |  | 15.0 | 8.2 | 60.0 | 2.6 |
|  |  | 15.2 | 8.8 | 79.9 | 3.6 |
|  |  | 15.4 | 9.5 | 100.1 | 5.1 |
|  |  | 15.6 | 10.4 | 111.0 | 6.8 |
| Comparative Example 1A | Copolymer A-2 | 9.0 | 3.5 | 20 | 1.2 |
|  |  | 11.9 | 5.8 | 40 | 1.5 |
|  |  | 12.6 | 6.9 | 60 | 2.1 |
|  |  | 13.2 | 9.2 | 80 | 3.0 |
|  |  | 13.4 | 9.9 | 100 | 4.3 |
|  |  | 13.6 | 14.1 | 111.1 | 6.0 |
| Comparative Example 2A | Copolymer A-3 | 9.0 | 2.6 | 20.1 | 2.2 |
|  |  | 14.0 | 5.7 | 40.0 | 3.8 |
|  |  | 15.0 | 7.8 | 60.0 | 6.0 |
|  |  | 15.2 | 8.4 | 79.9 | Unmeasurable* |
|  |  | 15.4 | 9.0 | 100.0 | Unmeasurable* |
|  |  | 15.6 | 9.8 | 111.1 | Unmeasurable* |

*It was not able to measure the turbidity as a uniform solution since the copolymer was precipitated to form a precipitate.

TABLE 5A

|  |  | Amount of n-heptane added (X)h to have turbidity of 10.0 NTU (wt % with respect to solution) | 80% of (X)h (wt % with respect to solution) |
|---|---|---|---|
| Example 1A | Copolymer A-1 | 15.5 | 12.4 |
| Comparative Example 1A | Copolymer A-2 | 13.4 | 10.7 |
| Comparative Example 2A | Copolymer A-3 | 15.7 | 12.6 |

|  |  | Amount of methanol added (X)m to have turbidity of 5.0 NTU (wt % with respect to solution) | 80% of (X)m (wt % with respect to solution) |
|---|---|---|---|
| Example 1A | Copolymer A-1 | 100.0 | 80.0 |
| Comparative Example 1A | Copolymer A-2 | 104.0 | 83.2 |
| Comparative Example 2A | Copolymer A-3 | 51.0 | 40.8 |

TABLE 6A

|  |  | Turbidity Th(80) (NTU) | Turbidity Tm(80) (NTU) |
|---|---|---|---|
| Example 1A | Copolymer A-1 | 4.4 | 3.6 |
| Comparative Example 1A | Copolymer A-2 | 4.8 | 3.2 |
| Comparative Example 2A | Copolymer A-3 | 4.3 | 4.0 |

(Measurement of Low Temperature Solubility)

While stirring the test solution A-1, methanol as the poor solvent was gradually added thereto to examine the amount of methanol added to precipitate the copolymer at room temperature (25° C.), and the copolymer was precipitated when methanol was added by 110 parts by weight of the test solution. The amount of the poor solvent added was set to 108.5 parts by weight (98.6% of 110 parts by weight) based on this value.

(Preparation of Test Solution)

Test solutions A-1-1 and A-2-1 were prepared in a hermetically sealable glass bottle using the copolymers A-1 and A-2 at the mix proportion described in Table 7A. After the copolymer was completely dissolved in a good solvent, a poor solvent was added thereto and then stirred for 4 hours as the procedure to add a poor solvent, thereby preparing a test solution. Temperature at the time of solution adjustment and stirring was 25° C.±1° C.

(Measurement of Precipitation Temperature)

The test solutions A-1-1 and A-2-1 charged in a hermetically sealable glass bottle were put in a thermostatic bath at 25° C., and the temperature of the thermostatic bath was lowered by 0.5° C. The test solution was held at that temperature for 5 minutes whenever the temperature was lowered by 0.5° C., and whether precipitation of the copolymer occurred or not was visually confirmed. This operation was repeated to measure the precipitation temperature of the copolymer. The results are presented in Table 8A.

TABLE 7A

|  |  | Copolymer | | Good solvent | | Poor solvent | |
| --- | --- | --- | --- | --- | --- | --- | --- |
|  |  | Kind | Amount (parts) | Kind | Amount (parts) | Kind | Amount (parts) |
| Example 1A | Test solution A-1-1 | A-1 | 20.0 | PGMEA | 80.0 | Methanol | 108.5 |
| Comparative Example 1A | Test solution A-2-1 | A-2 | 20.0 | PGMEA | 80.0 | Methanol | 108.5 |

TABLE 8A

|  |  | Copolymer | Precipitation temperature (° C.) |
| --- | --- | --- | --- |
| Example 1A | Test solution A-1-1 | A-1 | 21.5° C. |
| Comparative Example 1A | Test solution A-2-1 | A-2 | 22.5° C. |

<Evaluation of Resist Composition>

[Measurement of Sensitivity and Developing Contrast]

A resist composition was prepared using each of the copolymers obtained. In other words, 2 parts of triphenylsulfonium triflate of a photoacid generator was added to 100 parts of the copolymer, further PGMEA of the solvent was added thereto such that the polymer concentration became 12.5 mass % with respect to the total mass of the solution and mixed so as to obtain a uniform solution, and the solution was filtered through a membrane filter having a pore size of 0.1 μm, thereby obtaining a resist composition. The resist composition was spin coated onto a 6-inch silicon wafer and pre-baked (PAB) on a hot plate for 60 seconds at 120° C., thereby forming a thin film having a thickness of 300 nm. Eighteen shots of 10 mm×10 mm² were exposed using an ArF excimer laser exposure apparatus (trade name: VUVES-4500 manufactured by Litho Tech Japan Corporation) while changing the exposure amount. Subsequently, the thin film was post-baked (PEB) for 60 seconds at 110° C. and then developed in a 2.38% aqueous solution of tetramethylammonium hydroxide for 65 seconds at 23° C. using a resist development analyzer (trade name: RDA-800 manufactured by Litho Tech Japan Corporation) to measure the time course of the resist film thickness during the development in each exposure amount.

[Analysis]

On the basis of the data thus obtained, a curve (hereinafter, referred to as the exposure amount-residual film rate curve) was created by plotting the logarithm of the exposure amount (mJ/cm²) and the rate of residual film thickness (hereinafter, referred to as the residual film rate) (%) at the time point at which the initial film thickness was developed for 60 seconds, and the Eth sensitivity (it is an exposure amount required to have a residual film rate of 0% and represents the sensitivity) was determined as follows. It indicates that the sensitivity of the resist composition is higher as the value of the Eth sensitivity is smaller.

Eth sensitivity: exposure amount (mJ/cm²) in which the exposure amount-residual film rate curve intersected with the residual film rate of 0%.

The results are presented in Table 9A.

TABLE 9A

|  | Copolymer | Eth sensitivity |
| --- | --- | --- |
| Example 1A | A-1 | 1.05 |
| Comparative Example 1A | A-2 | 1.32 |
| Comparative Example 2A | A-3 | 1.02 |

As presented in Table 8A, it has been confirmed that the copolymer (Example 1A) of the invention has a lower precipitation temperature and exhibits superior solubility in a solvent at a low temperature in the evaluation described above as compared to the copolymers (Comparative Examples 1A and 2A) other than the invention. In addition, it was possible to suitably use the copolymer as a resist composition.

(Second Aspect)

(Measurement of Weight Average Molecular Weight and Molecular Weight Distribution)

The weight average molecular weight (Mw) and molecular weight distribution (Mw/Mn) of the copolymer were determined in terms of polystyrene by gel permeation chromatography under the following conditions (GPC conditions).

[GPC Conditions]

Apparatus: Tosoh high speed GPC apparatus HLC-8220GPC (trade name) manufactured by TOSOH CORPORATION, Separation column: one prepared by connecting three pieces of Shodex GPC K-805L (trade name) manufactured by SHOWA DENKO K.K. in series, Measurement Temperature: 40° C., Eluent: tetrahydrofuran (THF), Sample (in the case of copolymer): solution prepared by dissolving about 20 mg of the copolymer in 5 mL of THF and filtering the solution through a 0.5 μm membrane filter, Sample (in the case of polymerization reaction mixture): solution prepared by dissolving about 30 mg of a polymerization reaction mixture sampled in 5 mL of THF and filtering the solution through a 0.5 μm membrane filter, Flow rate: 1 mL/min, Injection volume: 0.1 mL, and Detector: differential refractometer.

Calibration curve I: a solution prepared by dissolving about 20 mg of standard polystyrene in 5 mL of THF and filtering the solution through a 0.5 μm membrane filter was injected into the separation column under the above conditions to determine the relation between the elution time and the molecular weight. As the standard polystyrene, the following standard polystyrenes (all of them are a trade name) manufactured by TOSOH CORPORATION were used.

F-80 (Mw=706,000),

F-20 (Mw=190,000),

F-4 (Mw=37,900),

F-1 (Mw=10,200),

A-2500 (Mw=2,630), and

A-500 (a mixture of Mw=682, 578, 474, 370, and 260).

(Quantification of Monomer)

The amount of the unreacted monomer remaining in the polymerization reaction mixture was determined by the following method.

The polymerization reaction mixture in the reactor was sampled by 0.5 g, this was diluted with acetonitrile and the total volume thereof was adjusted to 50 mL using a volumetric flask. This diluted solution was filtered through a 0.2 μm membrane filter, and the amount of the unreacted monomer in the diluted solution was determined for every monomer using the high performance liquid chromatography HPLC-8020 (product name) manufactured by TOSOH CORPORATION.

In this measurement, one piece of the Inertsil ODS-2 (trade name) manufactured by GL Sciences Inc. was used as the separation column, the mobile phase was a gradient system of water/acetonitrile, the flow rate was 0.8 mL/min, the UV-visible spectrophotometer UV-8020 (trade name) manufactured by TOSOH CORPORATION was used as the detector, the detection wavelength was 220 nm, the measurement temperature was 40° C., and the injection volume was 4 μL. Incidentally, the Inertsil ODS-2 (trade name) used as the separation column was a column having a silica gel particle size of 5 μm and a column internal diameter of 4.6 mm× a column length of 450 mm. The gradient conditions for the mobile phase were as follows, and the liquid A was water and the liquid B was acetonitrile. In addition, each of three kinds of monomer solutions having different concentrations was used as the standard solution in order to quantify the amount of the unreacted monomer.

Measurement time from 0 to 3 minutes: liquid A/liquid B=90 vol %/10 vol %.

Measurement time from 3 to 24 minutes: liquid A/liquid B=from 90 vol %/10 vol % to 50 vol %/50 vol %.

Measurement time from 24 to 36.5 minutes: liquid A/liquid B=from 50%/50 vol % to 0 vol %/100 vol %.

Measurement time from 36.5 to 44 minutes: liquid A/liquid B=0 vol %/100 vol %.

(Division of Copolymer by GPC)

The division of the copolymer was conducted by GPC under the following conditions (GPC conditions). The solid substance was obtained by distilling off the solvent from a solution of each fraction to obtain the copolymer contained in each fraction.

[GPC Conditions]

Apparatus: preparative type LC, LC-9105 (trade name) manufactured by Japan Analytical Industry Co., Ltd., Separation column: one prepared by connecting JAIGEL-2H and JAIGEL-3H (trade name) manufactured by Japan Analytical Industry Co., Ltd. in series, Measurement temperature: 40° C., Eluent: THF, Sample: solution prepared by dissolving about 1 g of the copolymer in 10 mL of THF and filtering the solution through a 0.5 μm membrane filter, Flow rate: 3.5 mL/min, Injection volume: 10 mL, Detector: differential refractometer, and Preparative Method: an eluate providing a peak attributed to the copolymer in the elution curve was divided into five equal parts so as to have equal volumes in order of elution, thereby separately taking five fractions.

(Measurement of Fractionated Copolymer Composition)

The fractionated copolymer composition in each of the five fractions that were separately taken by the method described above was measured by the following method.

About 5 parts by mass of the solid substance obtained by distilling off the solvent from each fraction was dissolved in about 95 parts by mass of deuterated dimethyl sulfoxide to prepare a sample solution. This sample solution was put in the NMR tube and analyzed using $^1$H-NMR (manufactured by JEOL Ltd., resonance frequency: 270 MHz). The copolymer composition of the copolymer was calculated from the integrated intensity ratio of the signals attributed to the respective constitutional units.

(Evaluation on Sensitivity of Resist Composition)

The resist composition was spin-coated onto a 6-inch silicon wafer and pre-baked (PAB) on a hot plate for 60 seconds at 120° C. and, thereby forming a resist film having a thickness of 300 nm. Eighteen shots of an area of 10 mm×10 mm were exposed using an ArF excimer laser exposure apparatus (trade name: VUVES-4500 manufactured by Litho Tech Japan Corporation) while changing the exposure amount. Subsequently, the resist film was post-baked (PEB) for 60 seconds at 110° C. and then developed in a 2.38% aqueous solution of tetramethylammonium hydroxide for 65 seconds at 23.5° C. using a resist development analyzer (trade name: RDA-806 manufactured by Litho Tech Japan Corporation). The time course of the resist film thickness during the development was measured for each of the resist films having each exposure amount.

On the basis of the data for the time course of the resist film thickness thus obtained, an exposure amount-residual film rate curve was created by plotting the relation between the logarithm of the exposure amount (unit: $mJ/cm^2$) and the rate (hereinafter, referred to as the residual film rate, unit: %) of the residual film thickness at the time point at which the initial film thickness was developed for 30 seconds. On the basis of this curve, the value of the exposure amount (Eth) required to have a residual film rate of 0% was determined. In other words, the exposure amount ($mJ/cm^2$) at the point at which the exposure amount-residual film rate curve intersected with a straight line for the residual film rate of 0% was determined as Eth. The value of this Eth represents the sensitivity, and it indicates that the sensitivity is higher as this value is smaller.

(Evaluation on Particle Size Distribution by Dynamic Light Scattering Method)

The complete dissolution was visually judged by mixing 20 parts of the copolymer with 80 parts of PGMEA and stirring the mixture while keeping it at 25° C. The particle size distribution was measured using the FPAR-1000 of a highly sensitive specification (manufactured by OTSUKA ELECTRONICS, Co., LTD.) equipped with a dilute system probe.

The autocorrelation function thus obtained was analyzed by the Marquardt method to obtain a particle size distribution curve.

Reference Example 1B: Design of Composition of Solution Sa

The present Example is an example using the second method as the method for designing the first composition of the solution Sa.

In the present Example, the composition of Sa in a case in which the monomers m-1, m-2, and m-3 represented by the following Formulas (m-1), (m-2), and (m-3) were polymerized to produce a copolymer having a target composition of m-1:m-2:m-3=40:40:20 (mol %) and a target value of the weight average molecular weight of 10,000 was determined. The monomer m-2 is the monomer having an acid leaving group among the three kinds of monomers.

The polymerization initiator used in the present Example was dimethyl-2,2'-azobisisobutyrate (V601 (trade name)). The polymerization temperature was 80° C.

[Chem. 4]

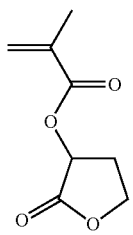

(m-1)

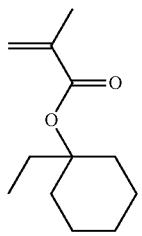

(m-2)

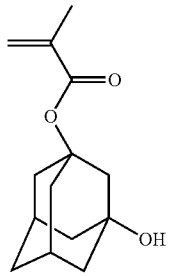

(m-3)

In a flask (reactor) equipped with a nitrogen inlet, a stirrer, a condenser, two dropping funnels, and a thermometer, 67.8 parts of ethyl lactate was charged in a nitrogen atmosphere. The flask was put in a hot water bath and the temperature of the hot water bath was raised to 80° C. while stirring the inside of the flask.

Thereafter, the following dropping solution containing a monomer mixture, a solvent, and a polymerization initiator was added to the flask dropwise through one dropping funnel over 4 hours at a constant dropwise addition speed, and the temperature of 80° C. was held for 3 hours. After 7 hours from the start of dropwise addition of the dropping solution, the flask was cooled to room temperature to stop the reaction.

Monomer m-1: 28.56 parts (40 mol %),
Monomer m-2: 32.93 parts (40 mol %),
Monomer m-3: 19.82 parts (20 mol %),
Ethyl lactate: 122.0 parts, and
Dimethyl-2,2'-azobisisobutyrate: 2.415 parts (2.5 mol % with respect to the total amount of the monomers supplied).

The polymerization reaction mixture in the flask was sampled by 0.5 g after 0.5, 1, 2, 3, 4, 5, 6, and 7 hours from the start of dropwise addition of the dropping solution, respectively, and the monomers m-1 to m-3 were quantified, respectively. This makes it possible to confirm the mass of each unreacted monomer remaining in the flask at the time of each sampling. As a result, for example, the results after 2, 3, and 4 hours from the start of dropwise addition are as presented in Table 1B.

TABLE 1B

|  | After 2 hours (parts by mass) | After 3 hours (parts by mass) | After 4 hours (parts by mass) |
|---|---|---|---|
| Monomer m-1(Mx) | 4.00 | 4.00 | 4.15 |
| Monomer m-2(My) | 7.24 | 7.75 | 7.96 |
| Monomer m-3(Mz) | 2.89 | 2.90 | 2.99 |

Subsequently, the mass of each unreacted monomer remaining in the flask at the time of each sampling was converted into the molar fraction (corresponding to Mx: My: Mz) thereof using the molecular weight of each monomer.

As a result, for example, the results after 2, 3, and 4 hours from the start of dropwise addition are as presented in Table 2B.

TABLE 2B

|  | After 2 hours (mol %) | After 3 hours (mol %) | After 4 hours (mol %) |
|---|---|---|---|
| Monomer m-1(Mx) | 32.36 | 31.22 | 31.42 |
| Monomer m-2(My) | 50.80 | 52.47 | 52.27 |
| Monomer m-3(Mz) | 16.84 | 16.31 | 16.31 |

Meanwhile, the total mass of each monomer supplied until each sampling was determined from the mass (total amount supplied) of each monomer supplied to the flask over 4 hours at a constant speed, and the mass of each monomer remaining in the flask at the time of each sampling was subtracted from the total mass, whereby the mass of the monomer, which had been converted into the copolymer in the monomer which had been supplied until that time, was calculated for each monomer at the time of each sampling.

Subsequently, the mass of the monomer, which had been converted into the copolymer during a period from a sampling time to another sampling time, was determined for each monomer by taking the differential data and converted into the molar fraction. The value of this molar fraction corresponds to the content ratio (referred to as the copolymer composition in some cases) Px: Py: Pz of the constitutional units in the copolymer produced during a period from a sampling time to another sampling time, namely, the copolymer produced during a period from a time t1 (reaction time) elapsed from the start of dropwise addition to another time t2, during a period from a time t2 to another time t3, . . . , respectively.

As a result, the copolymer which had a copolymer composition (Px: Py: Pz) that was the closest to the target composition 40: 40: 20 was a copolymer produced during the period from after 2 hours to after 3 hours from the start of dropwise addition, and it was Px:Py:Pz=41.05:38.47:20.48.

The factors Fx, Fy, and Fz are determined by Fx=Px/Mx, Fy=Py/My, and Fz=Pz/Mz using this value and the values (Table 2B) of Mx:My:Mz after 2 hours of time elapsed from the start of dropwise addition, and the results are Fx=1.27, Fy=0.76, and Fz=1.22. In addition, it is Gx=Fx=1.27, Gy=Fy/3=0.25, and Gz=Fz=1.22.

The composition x0: y0: z0 of Sa was determined using the values of the factors and the target composition.

x0=((40/1.27)/(40/1.27+40/0.25+20/1.22))=15.3 mol %.
y0=((40/0.25)/(40/1.27+40/0.25+20/1.22))=76.7 mol %.
z0=((20/1.22)/(40/1.27+40/0.25+20/1.22))=8.0 mol %.

Reference Example 2B: Design of Composition of Solution Sa

The case of using the first method described above as the method for designing the first composition of the solution Sa under the same conditions as in Reference Example 1B will be described.

As presented in Tables 1B and 2B, the fluctuation range was the smallest after 3 hours and after 4 hours from the start of dropwise addition in the time course of the composition of the unreacted monomers.

Hence, the average value of the molar fractions (Mx: My: Mz) of the unreacted monomers after 3 hours from the start of dropwise addition and the molar fractions (Mx: My: Mz) of the unreacted monomers after 4 hours is adopted as the composition (U) of the unreacted monomers.

Mx': My': Mz' of the composition (U) is as follows.
Mx'=31.3 mol %,
My'=52.4 mol %, and
Mz'=16.3 mol %.

In the present Example, the ratio of monomer m-2 having an acid leaving group among the monomers m-1, m-2, and m-3 is set to 1.5 times My' in the first composition of the solution Sa. (Ratio of m-1)/(ratio of m-3) in the first composition is set to be the same as Mx'/Mz'.

As a result, the first composition of the solution Sa is as follows.
Monomer m-1: 14.1 mol %,
Monomer m-2: 78.6 mol %, and
Monomer m-3: 7.3 mol %.

Example 1B

In the present Example, a step of supplying S1 to the reactor in advance and adding T1 and a polymerization initiator solution to the reactor dropwise was provided.

The composition of Sa determined in Reference Example 1B was used as the composition of S1. The kind of the monomers to be used, the kind of the polymerization initiator to be used, the polymerization temperature, the target composition of the copolymer, and the target value of the weight average molecular weight are the same as those in Reference Example 1B. The monomer composition (first composition) of S1 was set to be almost the same as the composition of Sa designed by a method using the factors described above, and the monomer composition (second composition) of T1 was set to be the same as the target composition.

In the relation between the monomer composition (first composition) of S1 in the present Example and the composition (U) of the unreacted monomers in Reference Example 2B, the content ratio (mol %) of the monomer containing an acid leaving group in the first composition was 1.46 times (it is presented in Table 8B. The same applies hereinafter. It is referred to as the "proportion of an acid leaving group in the first composition with respect to the composition (U)") the content ratio (mol %) of the monomer containing an acid leaving group in the composition (U).

In a flask equipped with a nitrogen inlet, a stirrer, a condenser, two dropping funnels, and a thermometer, the following S1 was charged in a nitrogen atmosphere. The flask was put in a hot water bath and the temperature of the hot water bath was raised to 80° C. while stirring the inside of the flask.

Thereafter, the following T1 and the following polymerization initiator solution were started to be supplied through different dropping funnels at the same time, and T1 and the polymerization initiator solution were added to the flask dropwise over 4 hours and 20 minutes, respectively. Furthermore, the temperature of 80° C. was held for 2 hours immediately after the supply of T1 was completed. After 7 hours from the start of dropwise addition of T1, the flask was cooled to room temperature to stop the reaction.

(S1)
Monomer m-1: 1.69 parts (15.3 mol %),
Monomer m-2: 9.42 parts (76.7 mol %),
Monomer m-3: 1.21 parts (8.0 mol %), and
Ethyl lactate: 99.3 parts.

(T1)
Monomer m-1: 29.75 parts (40 mol %),
Monomer m-2: 34.30 parts (40 mol %),
Monomer m-3: 20.65 parts (20 mol %),
Ethyl lactate: 118.8 parts, and
Dimethyl-2,2'-azobisisobutyrate: 2.119 parts (1.84 mol % with respect to the total amount of the monomers in S1 and T1).

(Polymerization Initiator Solution)
Ethyl lactate: 8.3 parts, and
Dimethyl-2,2'-azobisisobutyrate: 0.530 parts (0.48 mol % with respect to the total amount of the monomers in S1 and T1).

[Purification of Copolymer]

After 7 hours of the reaction time had elapsed, the flask was cooled to room temperature to stop the reaction, and the polymerization reaction mixture in the flask was added dropwise into a mixed solvent of methanol and water (volume ratio: methanol/water=80/20) in an amount to be about 10 times the polymerization reaction mixture while stirring, thereby obtaining a white precipitate (copolymer P1). The precipitate was separated through filtration, and the precipitate was put again in the same amount of a mixed solvent of methanol and water (volume ratio: methanol/water=90/10) and cleaned while stirring. Thereafter, the precipitate after cleaning was separated through filtration, thereby obtaining 160 parts of a wet copolymer powder. Ten parts of this wet copolymer powder was dried for about 40 hours at 40° C. under reduced pressure.

The white powder (copolymer P1) thus obtained was analyzed using $^1$H-NMR and GPC to determine Mw and Mw/Mn. The results are presented in Table 7B (the same applies hereinafter). In addition, the solubility (turbidity) of the copolymer was evaluated. The results are presented in Table 8B (the same applies hereinafter).

In addition, it was divided into five fractions by GPC, and the copolymer composition (fractionated copolymer composition) of the copolymer contained in each fraction was measured. The ratio $N(v_j)$ of the monomer containing an acid leaving group in the fractionated copolymer composition of each fraction is presented in Table 3B. $N(v_j)/N_{ave}$ of each fraction is presented in Table 7B (the same applies hereinafter).

TABLE 3B

| Fraction j | Ratio of monomer unit containing acid leaving group [unit: mol %] $N(v_j)$ |
|---|---|
| 1 | 40.9 |
| 2 | 39.7 |
| 3 | 39 |
| 4 | 39.6 |
| 5 | 39.7 |

[Measurement of Turbidity Th(80) and Tm(80) of 20 wt % PGMEA Solution]

In 80 parts of PGMEA, 20 parts of the copolymer P1 was completely dissolved (namely, a PGMEA solution containing the copolymer for 2 lithography at 20 wt % with respect to the total mass), and n-heptane or methanol in the amount presented in Table 4B was added thereto, and the solution was stirred for 4 hours. After 4 hours of stirring, the turbidity of each solution was measured using a turbidity meter (TB200 manufactured by Orbeco-Hellige, Inc). The stirring and the measurement were conducted at 25° C. The measurement results are presented in Table 4B.

From this result, the amount of n-heptane added (X)h to have a turbidity of 10 NTU was determined through calculation using the measurement results of the turbidity for two points sandwiching the turbidity of 10 NTU and also the amount of n-heptane to be 80% of (X)h was determined. The results are presented in Table 5B. In addition, the amount of methanol added (X)m to have a turbidity of 5.0 NTU was determined through calculation using the measurement results of the turbidity for two points sandwiching the turbidity of 5.0 NTU and also the amount of methanol to be 80% of (X)m was determined. The results are presented in Table 6B.

Subsequently, n-heptane in an amount to be 80% of (X)h and methanol in an amount to be 80% of (X)m were added to a PGMEA solution containing the copolymer for lithography at 20 wt % with respect to the total mass, respectively, the solutions were stirred for 4 hours, and the turbidity of the solutions thus obtained was then measured using a turbidity meter. The results are presented in Table 11B.

TABLE 4B

|  | n-heptane | | Methanol | |
|---|---|---|---|---|
|  | Amount added (wt % with respect to test solution) | Turbidity (NTU) | Amount added (wt % with respect to test solution) | Turbidity (NTU) |
| Copolymer P1 | 9.0 | 2.7 | 20.0 | 1.4 |
|  | 13.9 | 6.0 | 40.0 | 1.8 |
|  | 15.0 | 8.2 | 60.0 | 2.6 |
|  | 15.2 | 8.8 | 79.9 | 3.6 |
|  | 15.4 | 9.5 | 100.1 | 5.1 |
|  | 15.6 | 10.4 | 111.0 | 6.8 |

TABLE 5B

|  | Amount of n-heptane added (X)h to have turbidity of 10.0 NTU (wt % with respect to test solution) | 80% of (X)h (wt % with respect to solution) |
|---|---|---|
| Copolymer P1 | 15.5 | 12.4 |

TABLE 6B

|  | Amount of methanol added (X)m to have turbidity of 5.0 NTU (wt % with respect to test solution) | 80% of (X)m (wt % with respect to solution) |
|---|---|---|
| Copolymer P1 | 100.0 | 80.0 |

[Manufacture of Resist Composition]

The rest of the wet copolymer powder was put in 880 g of PGMEA and completely dissolved to prepare a copolymer solution, and the copolymer solution was then filtered through a nylon filter having a pore size of 0.04 μm (P-NYLON N66FILTER0.04M (product name) manufactured by Pall Corporation).

The copolymer solution thus obtained was heated under reduced pressure to distill off methanol and water, and further PGMEA was distilled off, thereby obtaining a copolymer P1 solution in which the concentration of the copolymer was 25 mass % with respect to the total mass of the copolymer P1 solution. At this time, the maximum ultimate vacuum was 0.7 kPa, the maximum solution temperature was 65° C., and the distillation off time was 8 hours.

A uniform solution was prepared by mixing 200 parts of the copolymer P1 solution thus obtained, 1 part of triphenylsulfonium triflate of the photoacid generator, and PGMEA as the solvent such that the copolymer concentration was 12.5 mass % with respect to the total mass of the solution and then filtered through membrane filter having a pore size of 0.1 μm, thereby obtaining a resist composition. The sensitivity of the resist composition thus obtained was evaluated by the method described above. The results are presented in Table 11B (the same applies hereinafter).

Example 2B

Example 2B was carried out in the same manner as in Example 1B except that the monomer m-1 in Example 1B was changed to the following Formula (m-1'). The results are presented in Table 10B and Table 11B.

[Chem. 5]

(m-1')

Comparative Example 1B

Comparative Example 1B was carried out in the same manner as in Example 1B except that the compositions of S1, T1, and the initiator solution in Example 1B were changed as follows, respectively.

In the present Example, the composition x0: y0: z0 of Sa was determined by the following Calculation Formula using the values of factors (Fx=L27, Fy=0.76, and Fz=L22) obtained in Reference Example 1B. The monomer composition of S1 was set to be almost the same as the composition of Sa and the monomer composition of T1 was set to be the same as the target composition.

The proportion of an acid leaving group in the first composition was 1.00 time that in the composition (U) when the monomer composition (first composition) of S1 in the present Example was compared to the composition (U) of the unreacted monomers in Reference Example 2B.

x0=40/1.27=31.45 moles y0=40/0.76=52.63 moles z0=20/1.22=16.39 moles (S1)
Monomer m-1: 3.99 parts (31.3 mol %),
Monomer m-2: 7.68 parts (52.4 mol %),
Monomer m-3: 2.88 parts (16.3 mol %), and
Ethyl lactate: 99.3 parts.
(T1)
Monomer m-1: 24.03 parts (40 mol %),
Monomer m-2: 27.71 parts (40 mol %),
Monomer m-3: 16.68 parts (20 mol %),
Ethyl lactate: 101.8 parts, and
Dimethyl-2,2'-azobisisobutyrate: 0.690 parts (0.7 mol % with respect to the total amount of the monomers in S1 and T1).
(Polymerization Initiator Solution)
Ethyl lactate: 2.0 parts, and
Dimethyl-2,2'-azobisisobutyrate: 1.280 parts (1.3 mol % with respect to the total amount of the monomers in S1 and T1).

In the same manner as in Example 1B, a comparative copolymer Q1 was obtained from the polymerization reaction mixture in the flask after 7 hours of the reaction time had elapsed. The comparative copolymer Q1 thus obtained was subjected to the same measurements and evaluation as in Example 1B.

In the same manner as in Example 1B, $N(v_j)$ in the present Example was determined. The results are presented in Table 7B. In the same manner as in Example 1B, Mw, Mw/Mn, and $N(v_j)$/Nave were determined. In the same manner as in Example 1B, the solubility (turbidity) and the sensitivity were evaluated.

TABLE 7B

| Fraction j | Ratio of monomer unit containing acid leaving group [unit: mol %] N(vj) |
|---|---|
| 1 | 38.3 |
| 2 | 39 |
| 3 | 39.1 |
| 4 | 40.4 |
| 5 | 40.5 |

Comparative Example 2B

Comparative Example 2B was carried out in the same manner as in Example 1B except that the compositions of S1, T1, and the initiator solution in Example 1B were changed as follows, respectively.

In the present Example, the monomer in S1 that was supplied to the reactor in advance was only the monomer containing an acid leaving group. The monomer composition of T1 was set to be the same as the target composition.

The proportion of an acid leaving group in the first composition was 1.91 times that in the composition (U) when the monomer composition (first composition) of S1 in the present Example was compared to the composition (U) of the unreacted monomers in Reference Example 2B.
(S1)
Monomer m-1: 0 parts (0 mol %),
Monomer m-2: 12.89 parts (100 mol %),
Monomer m-3: 0 parts (0 mol %), and
Ethyl lactate: 100.7 parts.
(T1)
Monomer m-1: 29.75 parts (40 mol %),
Monomer m-2: 34.30 parts (40 mol %),
Monomer m-3: 20.65 parts (20 mol %),
Ethyl lactate: 116.5 parts, and
Dimethyl-2,2'-azobisisobutyrate: 1.997 parts (1.73 mol % with respect to the total amount of the monomers in S1 and T1).
(Polymerization Initiator Solution)
Ethyl lactate: 10.4 parts, and
Dimethyl-2,2'-azobisisobutyrate: 0.666 parts (0.58 mol % with respect to the total amount of the monomers in S1 and T1).

In the same manner as in Example 1B, a comparative copolymer Q2 was obtained from the polymerization reaction mixture in the flask after 7 hours of the reaction time had elapsed. The comparative copolymer Q2 thus obtained was subjected to the same measurements and evaluation as in Example 1B.

In the same manner as in Example 1B, $N(v_j)$ in the present Example was determined. The results are presented in Table 8B. In the same manner as in Example 1B, Mw, Mw/Mn, and $N(v_j)$/Nave were determined. In the same manner as in Example 1B, the solubility (turbidity) and the sensitivity were evaluated.

TABLE 8B

| Fraction j | Ratio of monomer unit containing acid leaving group [unit: mol %] N(vj) |
|---|---|
| 1 | 44.9 |
| 2 | 41.7 |
| 3 | 40.1 |
| 4 | 40.4 |
| 5 | 40.9 |

Comparative Example 3B

A comparative copolymer Q3 was obtained in the same manner as the purification step of the copolymer in Example 1B using the polymerization reaction mixture in the flask that was obtained by cooling the flask to room temperature after 7 hours of the reaction time had elapsed to stop the reaction in Reference Example 1B. The comparative copolymer Q3 thus obtained was subjected to the same measurements and evaluation as in Example 1B.

In the same manner as in Example 1B, $N(v_j)$ in the present Example was determined. The results are presented in Table 9B. In the same manner as in Example 1B, Mw, Mw/Mn, and $N(v_j)$/Nave were determined. In the same manner as in Example 1B, the solubility (turbidity) and the sensitivity were evaluated.

TABLE 9B

| Fraction j | Ratio of monomer unit containing acid leaving group [unit: mol %] N(vj) |
|---|---|
| 1 | 36.2 |
| 2 | 37.3 |
| 3 | 37.5 |
| 4 | 39.0 |
| 5 | 40.4 |

Comparative Example 4B

In the present Example, two kinds of copolymers (Q4-1 and Q4-2) having different content ratios of the constitutional unit containing an acid leaving group were synthesized, respectively, by a method in which a dropping solution containing a monomer mixture, a polymerization initiator solvent, and a solvent was added to the reactor containing only the solvent dropwise at a constant dropwise addition speed, and a copolymer for lithography (Q4) was manufactured by a method to mix these together.

In a flask equipped with a nitrogen inlet, a stirrer, a condenser, two dropping funnels, and a thermometer, 81.8 parts of ethyl lactate was charged in a nitrogen atmosphere. The flask was put in a hot water bath and the temperature of the hot water bath was raised to 80° C. while stirring the inside of the flask.

Thereafter, the following dropping solution containing a monomer mixture, a solvent, and a polymerization initiator was added to the flask dropwise through one dropping funnel over 4 hours at a constant dropwise addition speed, and the temperature of 80° C. was held for 3 hours. After 7 hours from the start of dropwise addition of the dropping solution, the flask was cooled to room temperature to stop the reaction.

Monomer m-1: 25.50 parts (30 mol %),
Monomer m-2: 49.00 parts (50 mol %),
Monomer m-3: 23.60 parts (20 mol %),
Ethyl lactate: 147.2 parts, and
Dimethyl-2,2'-azobisisobutyrate: 2.070 parts (1.8 mol % with respect to the total amount of the monomers supplied).

The comparative copolymer Q4-1 was obtained from the polymerization reaction mixture in the flask after 7 hours of the reaction time had elapsed in the same manner as in Example 1I3. Mw of the comparative copolymer Q4-1 was 12200 and Mw/Mn thereof was 1.75.

In a flask equipped with a nitrogen inlet, a stirrer, a condenser, two dropping funnels, and a thermometer, 79.6 parts of ethyl lactate was charged in a nitrogen atmosphere. The flask was put in a hot water bath and the temperature of the hot water bath was raised to 80° C. while stirring the inside of the flask.

Thereafter, the following dropping solution containing a monomer mixture, a solvent, and a polymerization initiator was added to the flask dropwise through one dropping funnel over 4 hours at a constant dropwise addition speed, and the temperature of 80° C. was held for 3 hours. After 7 hours from the start of dropwise addition of the dropping solution, the flask was cooled to room temperature to stop the reaction.

Monomer m-1: 42.50 parts (50 mol %),
Monomer m-2: 29.40 parts (30 mol %),
Monomer m-3: 23.60 parts (20 mol %),
Ethyl lactate: 143.3 parts, and
Dimethyl-2,2'-azobisisobutyrate: 4.600 parts (4.0 mol % with respect to the total amount of the monomers supplied).

The comparative copolymer Q4-2 was obtained from the polymerization reaction mixture in the flask after 7 hours of the reaction time had elapsed in the same manner as in Example 1B. Mw of the comparative copolymer Q4-2 was 8500 and Mw/Mn thereof was 1.65.

The comparative mixed copolymer Q4 was obtained by mixing 57.5 parts of Q4-1 and 42.5 parts of Q4-2.

The comparative mixed copolymer Q4 thus obtained was subjected to the measurements and evaluation on the items presented in Table 10B and Table 11B in the same manner as in Example 1B.

TABLE 10B

|  | Mw | Mw/Mn | N(v1)/Nave | N(v2)/Nave | N(v3)/Nave | N(v4)/Nave | N(v5)/Nave |
|---|---|---|---|---|---|---|---|
| Example 1B | 10400 | 1.64 | 1.04 | 1.01 | 0.99 | 1.01 | 1.01 |
| Example 2B | 10600 | 1.62 | 1.04 | 1.01 | 1.00 | 0.99 | 1.00 |
| Comparative Example 1B | 10600 | 1.65 | 0.97 | 0.99 | 0.99 | 1.02 | 1.03 |
| Comparative Example 2B | 10200 | 1.64 | 1.10 | 1.02 | 0.98 | 0.99 | 1.00 |
| Comparative Example 3B | 10400 | 1.75 | 0.94 | 0.97 | 0.97 | 1.01 | 1.05 |
| Comparative Example 4B | 10600 | 1.74 | 1.08 | 1.00 | 0.96 | 0.94 | 0.94 |

TABLE 11B

| | Proportion of acid leaving group in first composition to that in composition (U) | Evaluation result | |
|---|---|---|---|
| | | Turbidity [NTU] | Sensitivity |
| | | Th(80) Tm(80) | [mJ/cm$^2$] |
| Example 1B | 1.46 times | 4.4    3.6 | 1.05 |
| Example 2B | 1.46 times | 4.5    3.4 | 0.92 |
| Comparative Example 1B | 1.00 time | 4.8    3.4 | 1.32 |
| Comparative Example 2B | 1.91 times | 4.3    4 | 1.02 |
| Comparative Example 3B | — | 4.8    3.2 | 1.61 |
| Comparative Example 4B | — | 4.9    4 | 1.96 |

<Measurement of Particle Size Distribution Curve>

Figure 2:
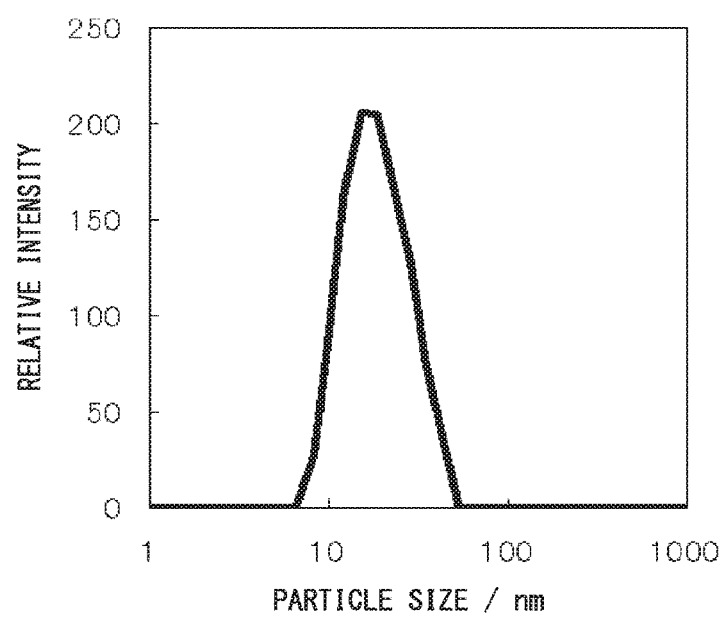
FIG. 2 is a particle size distribution curve by a dynamic light scattering method for Example 1B.
Figure 3:
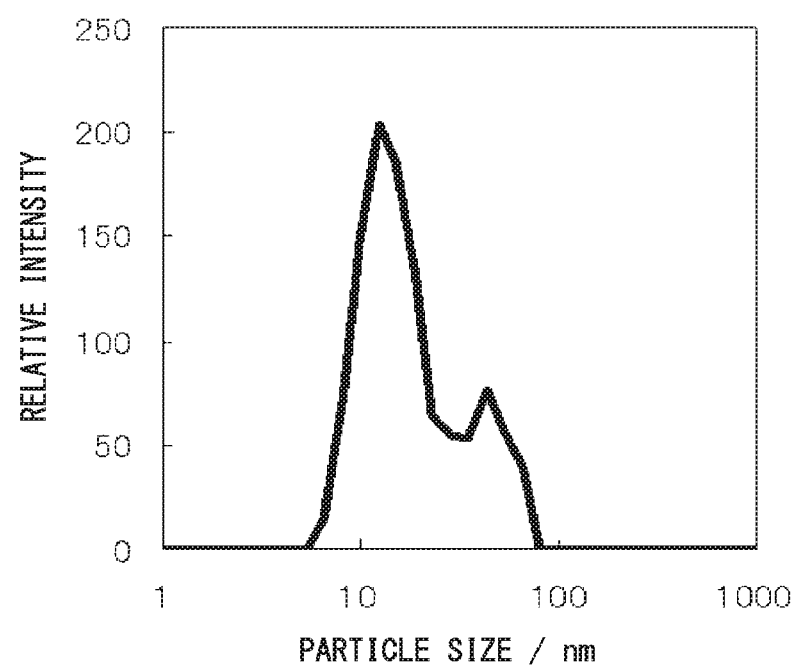
FIG. 3 is a particle size distribution curve by a dynamic light scattering method for Comparative Example 1B.

The copolymer P1 obtained in Example 1B and the comparative mixed copolymer Q4 obtained in Comparative Example 4B were subjected to the evaluation on the particle size distribution by a dynamic light scattering method. FIG. 2 illustrates the particle size distribution curve of Example 1B, and FIG. 3 illustrates the particle size distribution curve of Comparative Example 4B. The peak top was detected at 1 point in Example 1B and the peak top was detected at 2 points in Comparative Example 4B.

As the results are presented in Tables 7B and 8B, the copolymer P1 of Example 1B in which the value of N(v$_1$)/Nave, the turbidity Th(80), and the turbidity Tm(80) are within the ranges of the invention has a low turbidity so that it is visually judged to be transparent even when a low polarity solvent (heptane) or a highly polar solvent (methanol) is added thereto and thus the copolymer P1 exhibits excellent solubility. Hence, favorable uniformity of solubility in a developing solution is obtained in both the positive type development and the negative type development.

In addition, the resist composition prepared by using the copolymer P1 obtained in Example 1B exhibits excellent sensitivity.

On the other hand, the comparative copolymers Q1 and Q3 of Comparative Examples 1B and 3B exhibit inferior sensitivity as compared to Example 1B. In addition, particularly the solubility in a low polarity solvent is poor.

In addition, the comparative copolymer Q2 of Comparative Example 2B exhibits sensitivity and solubility in a low polarity solvent that are comparable to those in Example 1B, but the solubility thereof in a highly polar solvent is significantly inferior since the bias of an acid leaving group toward the higher molecular weight side is too great.

The comparative mixed copolymer Q4 that is a mixture of two kinds of copolymers of Comparative Example 4B exhibits low solubility in a low polarity solvent (heptane), and the solubility thereof in a highly polar solvent (methanol) was unmeasurable since the polymer was precipitated. In addition, the resist composition prepared by using the comparative mixed copolymer Q4 exhibits inferior sensitivity.

INDUSTRIAL APPLICABILITY

The copolymer for lithography of the invention exhibits excellent solubility in a solvent, the solubility (low temperature solubility) thereof in a solvent particularly at a low temperature is favorable, and the solubility thereof in a developing solution when being used in a resist composition is uniform so that high sensitivity is obtained, and the resist composition obtained by the manufacturing method of invention is a chemically amplified type and exhibits excellent solubility in a resist solvent, excellent sensitivity, and excellent solubility in a resist solvent at a low temperature, and thus it is significantly industrially useful.

The invention claimed is:

1. A copolymer for lithography having a turbidity Th(80) of 1.0 NTU or more and 4.6 NTU or less and a turbidity Tm(80) of 1.0 NTU or more and 3.8 NTU or less, wherein
the turbidity Th(80) is a turbidity of a PGMEA solution when n-heptane in an amount to be 80% of (X)h is added to the PGMEA solution where (X)h denotes an amount of n-heptane added to have a turbidity of 10 NTU when n-heptane is added to the PGMEA solution containing the copolymer for lithography at 20 wt % with respect to a total mass of the PGMEA solution; and
the turbidity Tm(80) is a turbidity of a PGMEA solution when methanol in an amount to be 80% of (X)m is added to the PGMEA solution where (X)m denotes an amount of methanol added to have a turbidity of 5.0 NTU when methanol is added to the PGMEA solution containing the copolymer for lithography at 20 wt % with respect to a total mass of the PGMEA solution.

2. The copolymer for lithography according to claim 1, comprising an acid leaving group.

3. A copolymer for lithography obtained by polymerizing at least one monomer comprising an acid leaving group and at least one monomer which does not contain acid leaving group,
wherein:
N(v1)/Nave of the copolymer for lithography is from 1.01 to 1.09, a turbidity Th(80) is 1.0 NTU or more and 4.7 NTU or less, and a turbidity Tm(80) is 1.0 NTU or more and 3.9 NTU or less;
N(v1)/Nave is a numerical value obtained by dividing N(v1) by Nave where a ratio of the number of moles of a constitutional unit containing an acid leaving group with respect to the number of total moles of constitutional units constituting a copolymer contained in a first fraction that is most previously eluted among five fractions of an eluate divided in order of elution so as to have equal volumes, the eluate providing a peak attributed to the copolymer in an elution curve obtained by gel permeation chromatography (GPC), is denoted as $N(v_1)$ mol % and a ratio of the number of moles of a constitutional unit containing an acid leaving group with respect to the number of total moles of constitutional units constituting the copolymers contained in all of the five fractions is denoted as $N_{ave}$ mol %;

the turbidity Th(80) is a turbidity of a PGMEA solution when n-heptane in an amount to be 80% of (X)h is added to the PGMEA solution where (X)h denotes an amount of n-heptane added to have a turbidity of 10 NTU when n-heptane is added to the PGMEA solution containing the copolymer for lithography at 20 wt % with respect to a total mass of the PGMEA solution; and the turbidity Tm(80) is a turbidity of a PGMEA solution when methanol in an amount to be 80% of (X)m is added to the PGMEA solution where (X)m denotes an amount of methanol added to have a turbidity of 5.0 NTU when methanol is added to the PGMEA solution containing the copolymer for lithography at 20 wt % with respect to a total mass of the PGMEA solution.

4. The copolymer for lithography according to claim 2, wherein the acid leaving group is a (meth)acrylic acid ester residue having a tertiary carbon atom at a bonding site with a (meth)acryloyloxy group.

5. The copolymer for lithography according to claim 2, wherein a constitutional unit having the acid leaving group is at least one selected from the group consisting of a constitutional unit units represented by Formulas (i) to (iv):

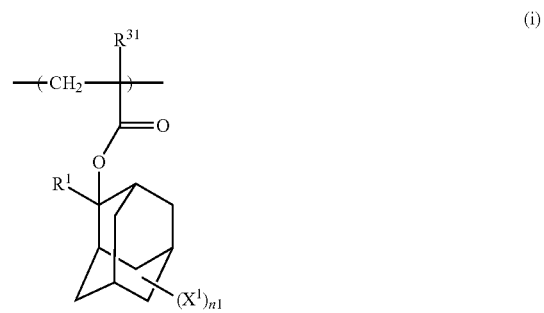

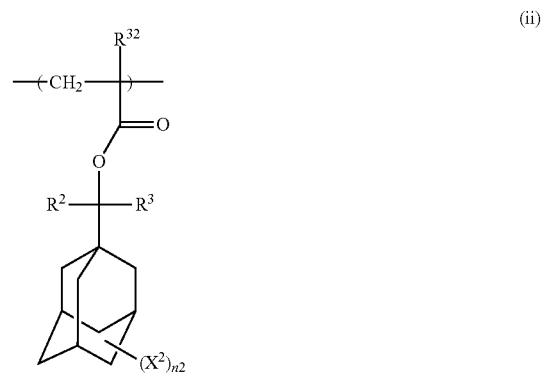

-continued

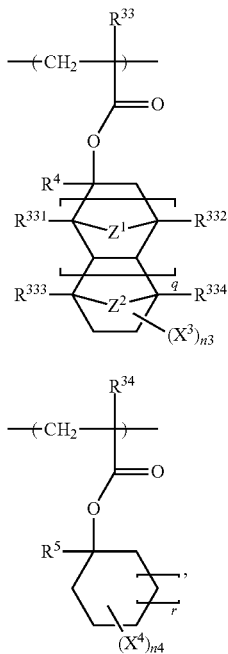

wherein:

$R^{31}$, $R^{32}$, $R^{33}$, and $R^{34}$ each independently represent a hydrogen atom or a methyl group;

$R^1$, $R^4$, and $R^5$ each independently represent an alkyl group having from 1 to 5 carbon atoms;

$R^2$ and $R^3$ each independently represent an alkyl group having from 1 to 3 carbon atoms;

$X^1$, $X^2$, $X^3$, and $X^4$ each independently represent an alkyl group having from 1 to 6 carbon atoms;

n1, n2, n3, and n4 each independently represent an integer from 0 to 4;

a plurality of $X^1$, $X^2$, $X^3$, or $X^4$ are present in one constitutional unit in a case in which n1, n2, n3, or n4 is 2 or more, and the plurality of $X^1$, $X^2$, $X^3$, and $X^4$ may be the same as or different from one another;

$R^{331}$, $R^{332}$, $R^{333}$, and $R^{334}$ each independently represent a hydrogen atom or an alkyl group having from 1 to 6 carbon atoms;

$Z^1$ and $Z^2$ each independently represent —O—, —S—, —NH—, or an alkylene group having from 1 to 6 carbon atoms;

q represents 0 or 1; and r represents an integer from 0 to 2.

6. The copolymer according to claim 2, further comprising a constitutional unit having a lactone skeleton.

7. The copolymer for lithography according to claim 2, further comprising a constitutional unit comprising at least one of —C(CF$_3$)$_2$—OH, a hydroxyl group, a cyano group, a methoxy group, a carboxy group, and an amino group.

8. A resist composition, comprising the copolymer of claim 1 and a compound which generates an acid by irradiation with an actinic ray or radiation.

9. A method for manufacturing a substrate having a pattern formed thereon, the method comprising:

coating the resist composition according to claim 8 on a substrate to be processed;

exposing the substrate to light having a wavelength of 250 nm or less; and developing the substrate with a developing solution.

* * * * *

UNITED STATES PATENT AND TRADEMARK OFFICE
CERTIFICATE OF CORRECTION

| | | |
|---|---|---|
| PATENT NO. | : 10,336,851 B2 | Page 1 of 1 |
| APPLICATION NO. | : 14/912798 | |
| DATED | : July 2, 2019 | |
| INVENTOR(S) | : Atsushi Yasuda et al. | |

It is certified that error appears in the above-identified patent and that said Letters Patent is hereby corrected as shown below:

On the Title Page

Item (73), the Assignee's information is incorrect. It should read:
--(73) Assignee: Mitsubishi Chemical Corporation, Tokyo (JP)--

Signed and Sealed this
Twenty-first Day of April, 2020

Andrei Iancu
*Director of the United States Patent and Trademark Office*